United States Patent [19]
Andoh et al.

[11] Patent Number: 5,093,561
[45] Date of Patent: Mar. 3, 1992

[54] DRAWING SURFACE ADJUSTING MECHANISM FOR SCANNING PATTERN DRAWING APPARATUS

[75] Inventors: Hiroaki Andoh; Michio Ohshima; Yuji Matsui; Takashi Okuyama; Toshitaka Yoshimura; Hidetaka Yamaguchi; Yasushi Ikeda; Jun Nonaka; Tamihiro Miyoshi; Mitsuo Kakimoto; Masatoshi Iwama; Hideyuki Morita; Satoru Tachihara; Akira Morimoto; Akira Ohwaki, all of Tokyo, Japan

[73] Assignee: Asahi Kogaku Kogyo K.K., Tokyo, Japan

[21] Appl. No.: 733,078

[22] Filed: Jul. 18, 1991

Related U.S. Application Data

[63] Continuation of Ser. No. 588,530, Sep. 26, 1990, abandoned, which is a continuation of Ser. No. 444,219, Dec. 1, 1989, abandoned.

[30] Foreign Application Priority Data

Dec. 1, 1988 [JP] Japan .................... 63-304781

[51] Int. Cl.$^5$ ............................................. G01J 1/20
[52] U.S. Cl. .................................. 250/201.4; 250/548
[58] Field of Search ............ 250/234, 236, 235, 201.4, 250/202, 548; 346/108, 160; 358/296, 302, 494; 356/1, 4; 354/403

[56] References Cited

U.S. PATENT DOCUMENTS

| 4,650,983 | 3/1987 | Suwa | 250/548 |
| 4,686,359 | 8/1987 | Yokoi et al. | |
| 4,714,933 | 12/1987 | Suzuki | 346/108 |

FOREIGN PATENT DOCUMENTS

3538062A1  4/1986  Fed. Rep. of Germany .

Primary Examiner—David C. Nelms
Attorney, Agent, or Firm—Sughrue, Mion, Zinn, Macpeak & Seas

[57] ABSTRACT

A drawing surface adjusting mechanism suitable for use with a large scanning pattern drawing apparatus in which a scanning optical system scans drawing rays of light along scanning lines on a workpiece on a drawing board. A plurality of light-emitting units project rays of light in a wavelength region outside a sensitivity range of the workpiece onto a drawing surface of the workpiece in such a way that the rays substantially converge at more than one point along a scanning line of the drawing rays of light, preferably at center and end points along the scanning line. A plurality of condenser lenses are provided for focusing beams of light from the plural light-emitting units after the beams have been reflected by the drawing surface. A plurality of light-detecting elements are disposed at points of condensation by respective ones of the condenser lenses to produce output signals representing differences in condensation points that occur as the lenses depart from or approach the drawing surface. A drive unit effects relative displacement between the scanning optical system and the drawing board in response to the outputs from the light-detecting elements.

24 Claims, 29 Drawing Sheets

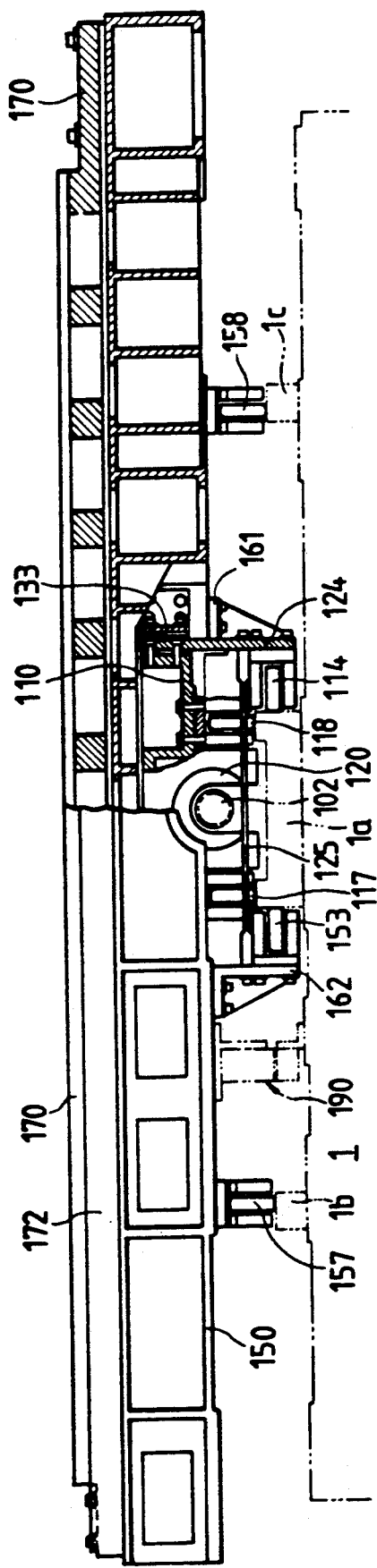
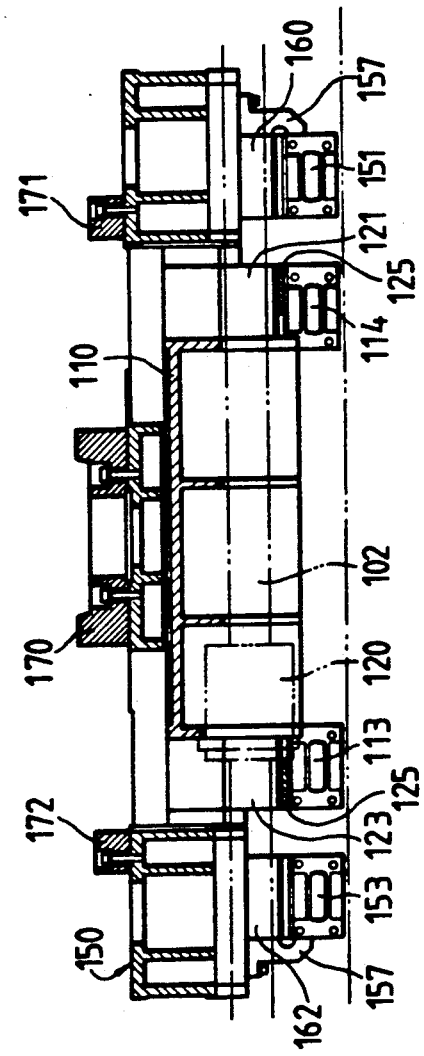

DRAWING SURFACE

DRAWING SURFACE ADJUSTING MECHANISM FOR SCANNING PATTERN DRAWING APPARATUS

This is a continuation of Application Ser. No. 07/588,530 filed on Sept. 26, 1990, which is a continuation of Application Ser. No. 07/444,219 filed on Dec. 1, 1989, both abandoned.

BACKGROUND OF THE INVENTION

The present invention relates to a scanning pattern drawing apparatus such as a laser plotter that draws patterns by scanning with laser light. In particular, the present invention relates to a mechanism for detecting both the distance between the drawing surface and the associated optical system and the inclination of the drawing surface with respect to the latter and which corrects the detected data if necessary.

Conventional laser plotters are generally intended to draw patterns with a comparatively low precision. The diameter of the beam spot which determines the minimum line width is typically on the order of 30 μm. To allow for pattern drawing with a higher precision and a smaller line width, the spot diameter must be further reduced by shortening the focal length of the scanning lens. However, a scanning lens with a shorter focal length unavoidably has a smaller depth of focus, so that if the workpiece on which a pattern is to be drawn is displaced either upward or downward with respect to the optical system, the entire drawing surface may be located beyond the depth of focus. On the other hand, if the drawing surface is inclined with respect to the optical system, part of a scanning field or subfield may be located beyond the depth of focus.

To overcome these problems, some provision must be made for detecting the displacement or inclination of the workpiece and performing the necessary corrections. In practice, however, a large scanning pattern drawing apparatus involves considerable difficulty in focusing at various positions of a single scan stroke by vertical movements of the drawing surface, and hence it is desired that the position of the drawing surface be held constant for a single stroke of scanning.

If detection of the position of the drawing surface relative to the optical system is performed at only one point, failure to focus is most likely to occur. Consider, for example, the case of performing position detection at one point on the center line of the scan width. This presents no problem if the drawing surface is level over the entire portion of the scan width or if it is inclined linearly. However, if its inclination is not linear, as shown in FIG. 37, and if the drawing surface is driven vertically on the basis of the results of detection at a central point B, the focus will be at the dashed line. In other words, only one limit of the depth of focus of the lens is utilized, and point A may be located beyond this depth of focus. If, on the other hand, the drawing surface is driven vertically on the basis of the average of the results of detection at two points A and C, the focus will be at the dot-dash line. Thus, both limits of the depth of focus are effectively used to increase the possibility that all points on the drawing surface will fall within the proper range of focus.

However, if the profile of the drawing surface is curved upward as shown in FIG. 38, vertically moving the drawing surface on the basis of the results of detection at the two end points A and C is not recommendable since point B is highly likely to be located beyond the depth of focus. In such a case, the results of detection at three points A, B and C are desirably averaged to provide a basis for vertical movements of the drawing surface.

Thus, the possibility of drawing patterns with high precision can be increased by increasing the number of detection points even if focusing is to be achieved merely by moving the drawing surface in a vertical direction.

SUMMARY OF THE INVENTION

An object, therefore, of the present invention is to provide a drawing surface adjusting mechanism that is suitable for use with a large scanning pattern drawing apparatus.

This object of the present invention can be attained by a mechanism which comprises a plurality of light-emitting units by which rays of light in a wavelength region outside the sensitivity range of the workpiece on a drawing board are projected onto the drawing surface of the workpiece in such a way that they will substantially converge at more than one point on a scanning line of the drawing rays of light issuing from a scanning optical system; a plurality of condenser lenses that focus the beams of light from the plural light-emitting units after the beams have been reflected by the drawing surface; a plurality of light-detecting elements that are disposed on the points of condensation by the respective condenser lenses and which produce as output signals the differences in condensation point that occur as the lenses depart from or come closer to the drawing surface; and drive means for causing a relative displacement between the positions of the scanning optical system and the drawing board on the basis of the outputs from the plural light-detecting elements.

BRIEF DESCRIPTION OF THE DRAWINGS

FIG. 5 is a cross section of FIG. 4 as seen looking in the direction indicated by arrows V;

FIG. 6 is a cross section of FIG. 4 as seen looking in the direction indicated by arrows VI;

DESCRIPTION OF THE PREFERRED EMBODIMENTS

Figure 1:
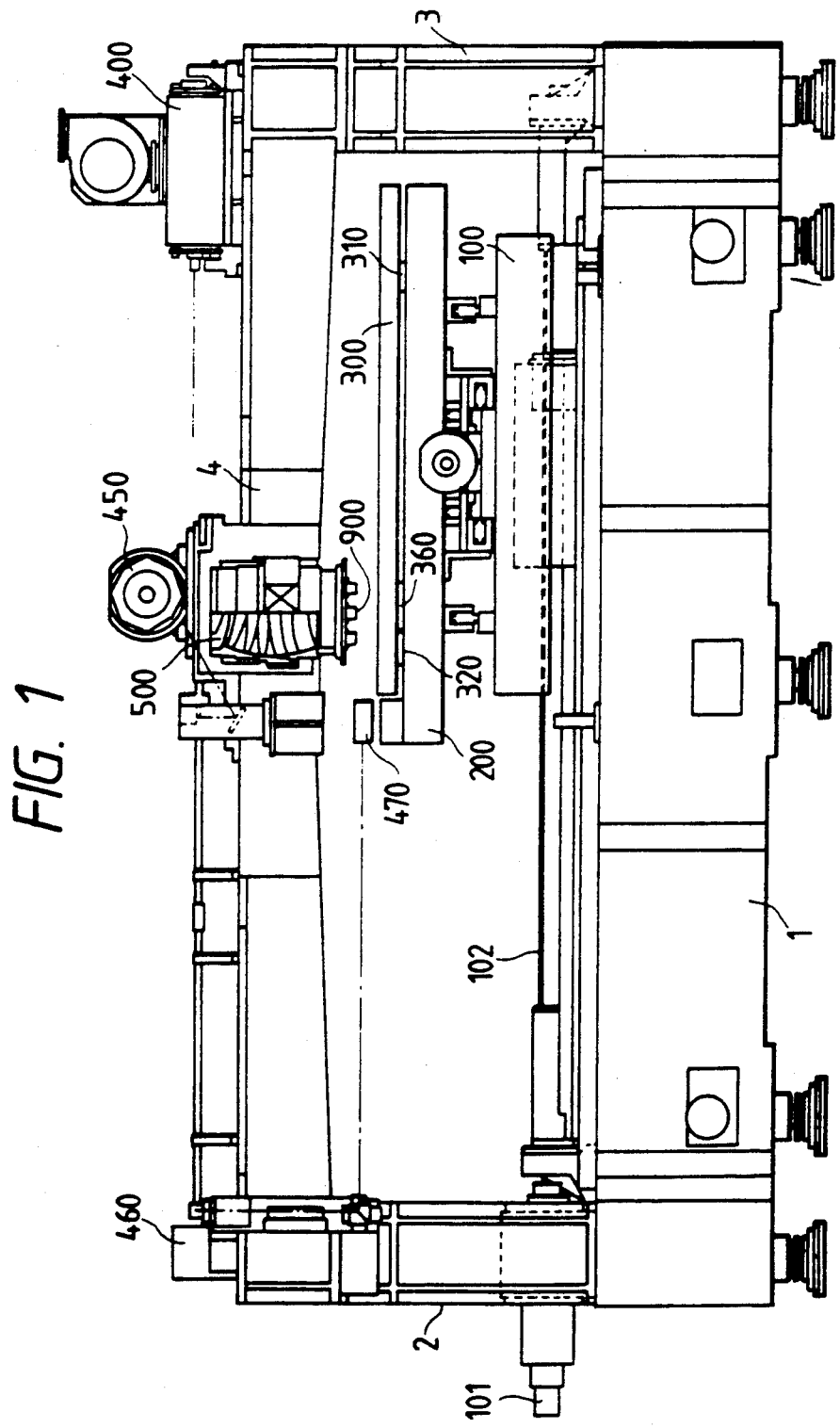
FIG. 1 is a side view, of a laser photoplotter incorporating a drawing surface adjusting mechanism according to a preferred embodiment of the present invention.

The drawing surface adjusting mechanism of the present invention will be described hereinafter with reference to a preferred embodiment described with reference to the case of a laser photoplotter which draws a precise pattern on a workpiece such as a photographic film.

Figure 2:
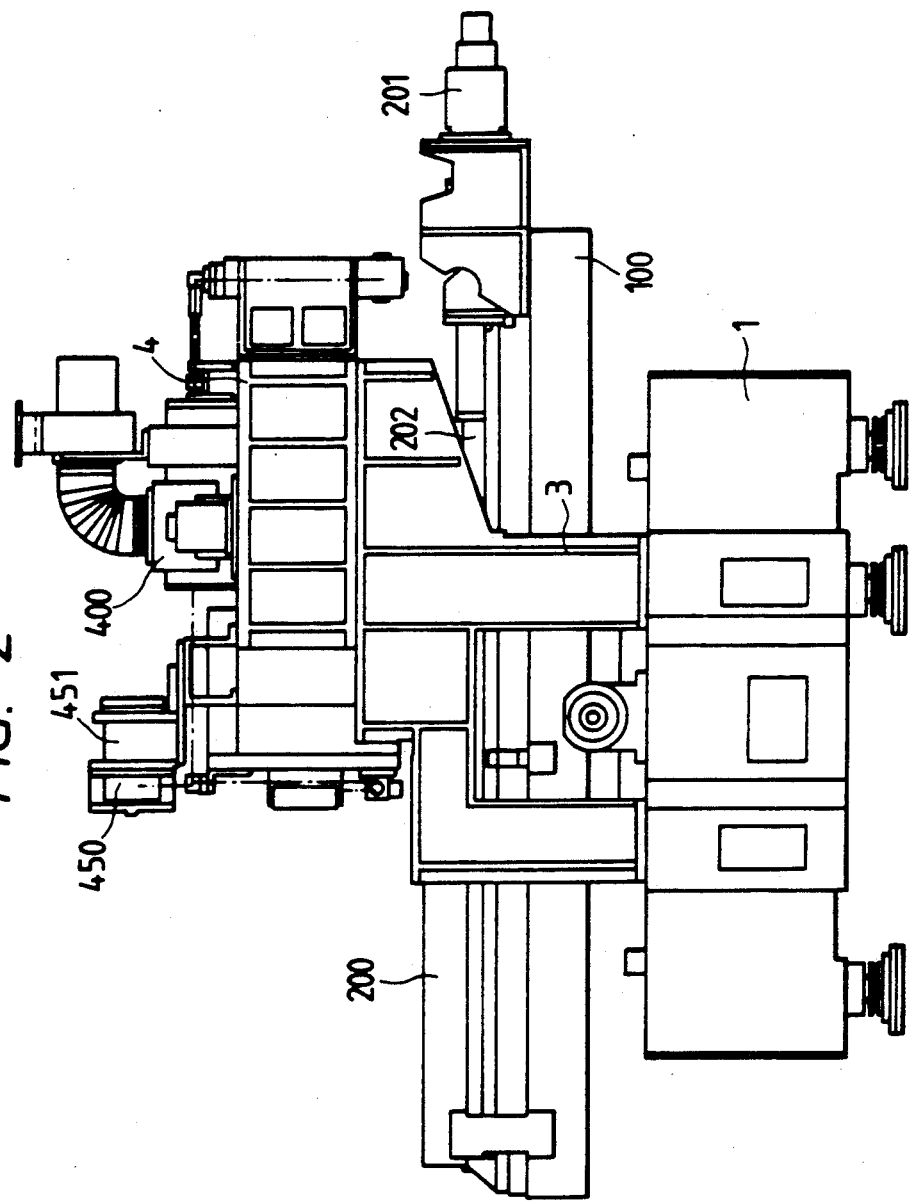
FIG. 2 is a front view of the same laser photoplotter.
Figure 3:
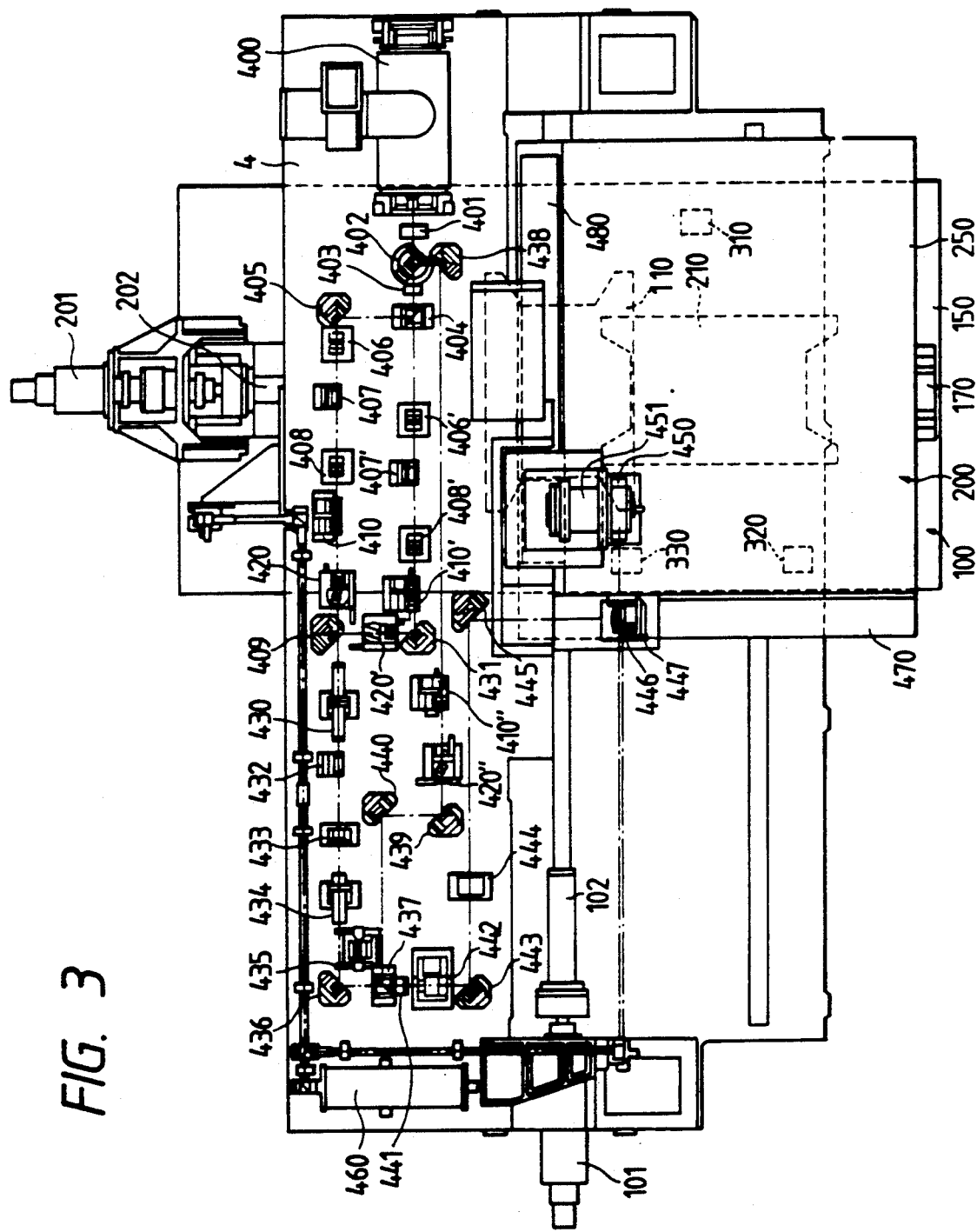
FIG. 3 is a plan view of the same laser photoplotter.

The overall system of the apparatus is first described schematically with reference to FIGS. 1 to 3.

The apparatus is composed basically of a main body 1 having an X table 100 and a Y table 200 disposed thereon and an optical head unit 4 secured above the tables by support columns 2 and 3 located at opposite ends of the length of the main body 1. The X table 100 is adapted to be slidable unidirectionally on the frame of the main body 1 and driven with an X-axis motor 101 via a ball screw 102. The Y table 200 is adapted to be slidable along guide rails on the X table 100 and driven with a Y-axis motor 201 via a ball screw 202. As shown in FIG. 3, a drawing board 300 on the Y table is supported by three AF drive units 310, 320 and 330 in such a way that it is capable of vertical movements and tilting.

The optical head unit 4 contains scanning optical elements such as a polygonal mirror 450 for deflecting the beam from a scanning laser 400 and an fθ lens 500 by which the beam reflected from the polygonal mirror 450 is converged on the drawing surface. A laser-operated measuring device is also provided for exact positioning of the tables. This device has a known construction in which the beam from a laser 460 is divided into two components, one being reflected from an X-axis mirror unit 470 fixed to the Y table 200 and the other being reflected from a Y-axis mirror 480 also fixed to the Y table 200, with the reflected beam being detected for measuring the amounts of displacement of the respective tables. The polygonal mirror 450 is secured to a spindle unit 451 at one end of the optical head unit 4 and is freely rotatable in a plane perpendicular to the drawing board 300.

As in the apparatus of the present invention, a conventional system of drawing patterns by vector scanning also used an XY coordinate table. However, because the beam direction was fixed, the action of the two axes was totally mechanical, resulting in slow drawing speeds. An improved system was therefore developed by adapting the tables to be driven on a single axis. In the improved system, the tables are caused to slide in only one direction and patterns are described by raster scanning the drawing surface with an optical head designed as a scanning optical system. However, the conventional raster scanner is intended to draw patterns with a comparatively low precision and the diameter of the beam spot, which determines the minimum line width, is approximately 30 μm. If more precise pattern drawing is required, a brighter scanning lens having a shorter focal length and hence a smaller F number must be employed to reduce the spot size. In this case though, if the scanning angle is the same, the scan width is reduced, and so is the depth of focus.

To deal with this problem, the apparatus of the embodiment under consideration is so designed that instead of covering the whole width of the drawing surface in the direction of main scanning by a single stroke of scanning, the width is divided into a plurality of lanes, and the tables are driven about two axes to insure that a pattern can be drawn over the entire width in the main scanning direction by several strokes of scanning. In this connection, it should be mentioned that the apparatus of the present invention which basically relies upon raster scanning does not need to drive the tables in both directions as in the conventional vector scanner, and the driving about each axis during pattern drawing is effected in only one direction to eliminate the possible effects of lost motion.

The problem of small depth of focus is solved in the present invention by providing an auto focus (AF) mechanism and vertically moving the drawing board 300 with respect to the optical head unit 4 so that it will always be held at the appropriate position.

The basic operation of the system is as follows.

The X table 100 moving with respect to the fixed optical head unit 4 is scanned with a beam spot for pattern drawing. When scanning in the X-axis direction for covering a predetermined width is completed, the Y table 200 is moved by an amount corresponding to this scan width and the X table 100 is returned to the same position as it was when the writing operation started. Movement of the X table 100 is resumed and pattern is drawn on the workpiece by continued scanning.

The constructions of the X and Y tables are described below in detail.

Figure 4:
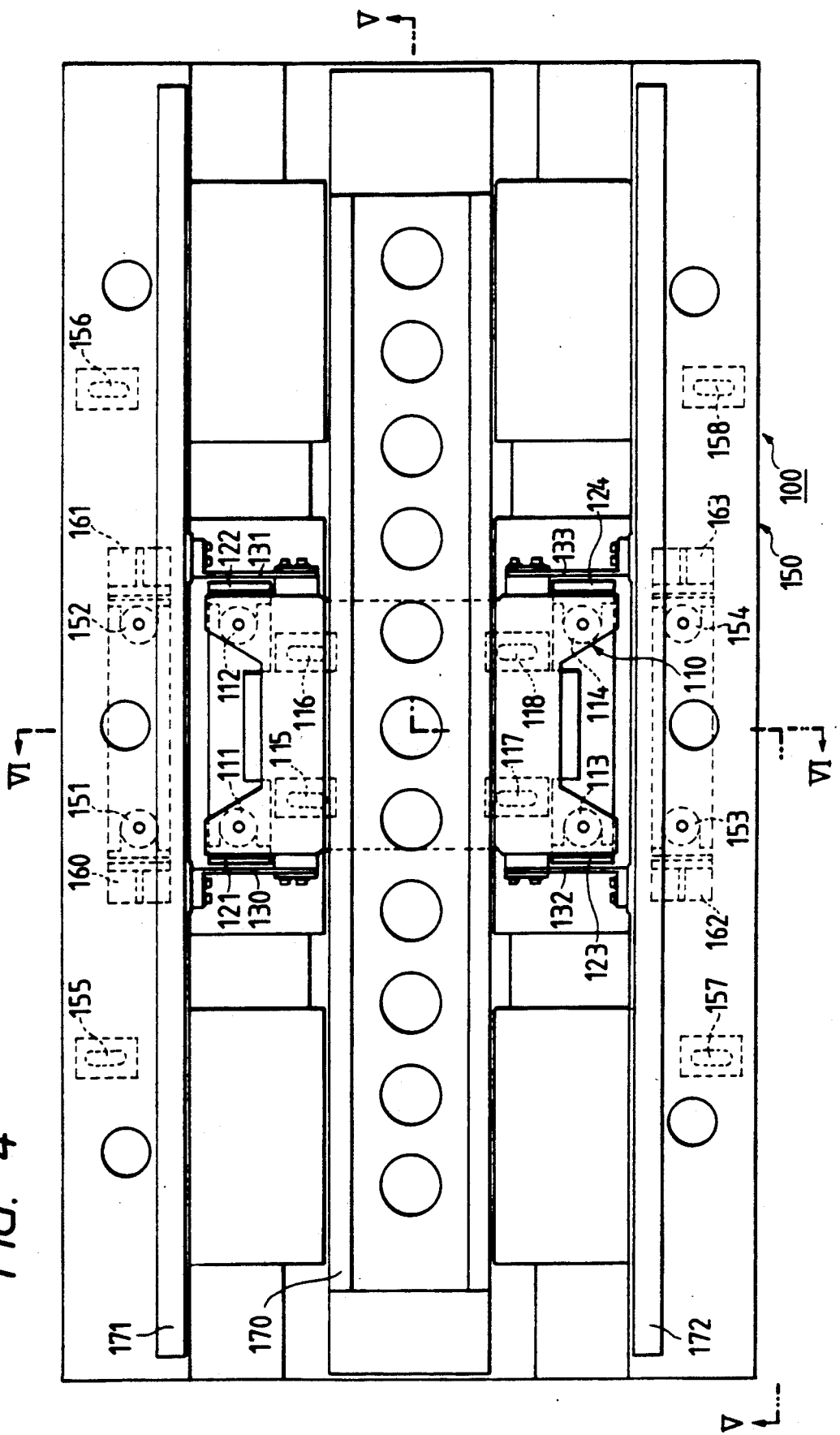
FIG. 4 is a plan view of an X coordinate table.

As shown in FIGS. 4 to 6, the X table 100 has a dual structure composed of a master table 110 positioned in the central part to have the drive force of the X-axis motor 101 transmitted directly and a working table 150 mounted around this master table to be slidable in the same direction and which is coupled thereto by means of four leaf springs 130, 131, 132 and 133 (see FIG. 4).

As shown in FIGS. 4 and 5, the master table 110 is furnished with four horizontal rollers 111, 112, 113 and 114 that laterally abut against a main rail 1a on the main body 1 to define the direction in which the master table is to slide, and four vertical rollers 115, 116, 117 and 118 that abut against the main rail 1a from above to support the weight of the master table. A nut 120 in threadable engagement with the ball screw 102 is secured to the master table 110 and generates a driving force in the X-axis direction as the X-axis motor 101 rotates.

The horizontal rollers are supported by plates 121, 122, 123 and 124 at the four corners of the master table 110 and every two support plates that face each other via the main rail 1a are coupled by a reinforcing member in plate form 125, as shown in FIG. 5.

The working table 150 is furnished with four horizontal rollers 151, 152, 153 and 154 that laterally abut against the main rail 1a to define the direction in which the working table is to slide, and four vertical rollers 155, 156, 157 and 158 that abut downward against subrails 1b and 1c disposed on the main body 1 via the main rail and which support the weight of the working table. The respective horizontal rollers are supported by angles 160, 161, 162 and 163 reinforced with triangular plates. The working table 150 is also furnished with a main rail 170 and subrails 171 and 172 for supporting the Y table 200 which are disposed at right angles to the rails on the main body 1.

According to the arrangement described above, the drive force of the X-axis motor 201 as applied to the master table 110 is transmitted to the working table 150 through the four leaf springs 130, 131, 132 and 133, thereby causing said working table to slide. Since the leaf springs are arranged to have rigidity in the direction in which the working table 150 slides, the thrust force received by the master table 110 will be transmitted unchanged to the working table 150. On the other hand, these leaf springs are elastic in a direction perpendicular to the sliding direction, so even if the master table 110 yaws on account of a force component in the radial direction, the leaf springs absorb the yawing, allowing only the force in the thrust direction to be transmitted to the working table 150. Hence, the yawing of the working table 150 can be effectively suppressed without using any special means such as an electrical compensator, and adverse effects that could otherwise occur during precise pattern drawing on account of errors in the movement of the tables are eliminated by a simple construction.

Figure 7:
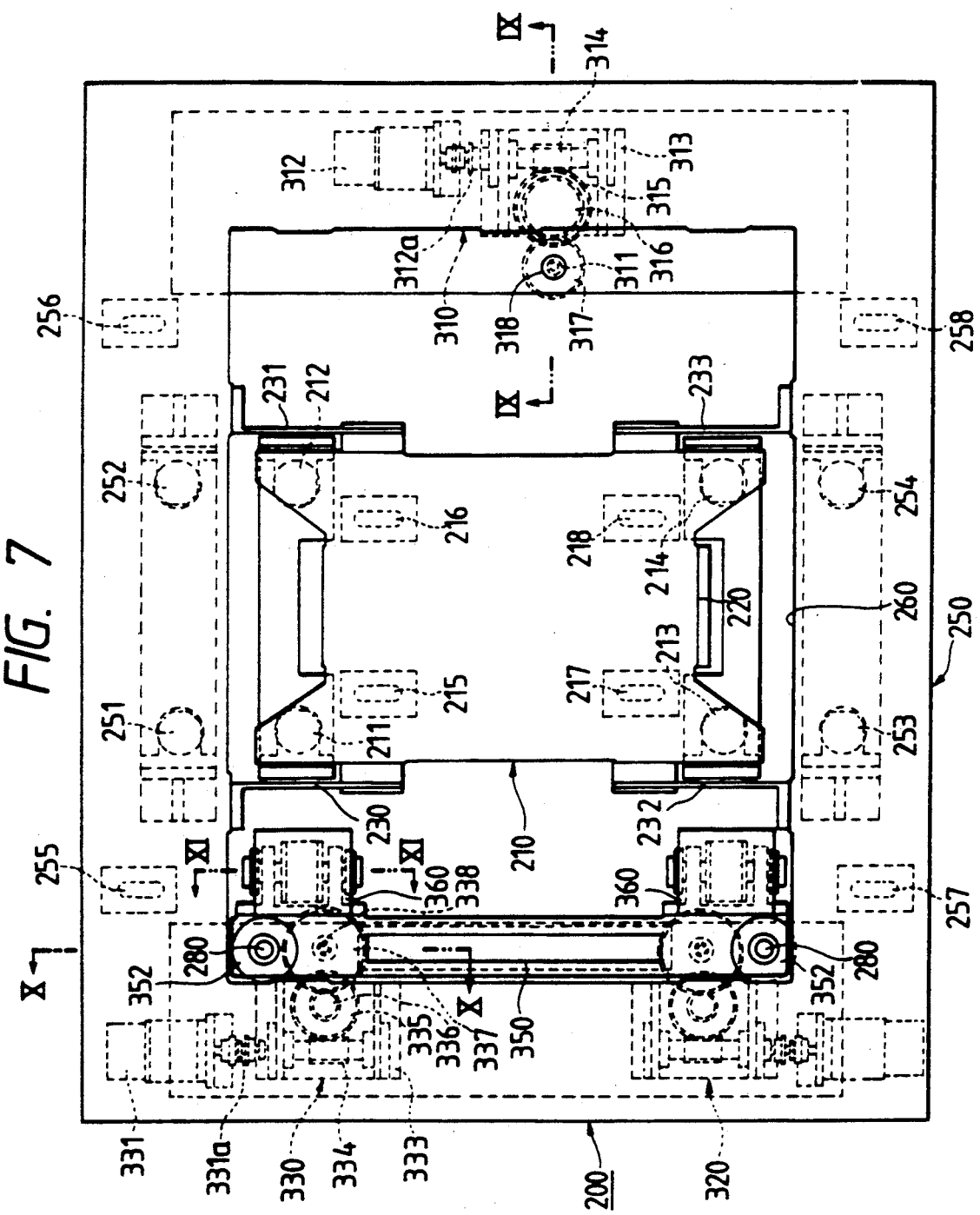
FIG. 7 is a plan view of a Y coordinate table.

FIG. 7 shows the Y table 200. Its construction is basically the same as that of the X table 100 described above, having a master table 210 coupled to a working table 250 via four leaf springs 230, 231, 232 and 233. The master table 210 is furnished with four horizontal rollers 211, 212, 213 and 214 that abut laterally against the main rail 170 on the working table 150 in the X table 100 for defining the direction in which the master table is to slide, and vertical rollers 215, 216, 217 and 218 that abut against the main rail 170 from above to support the weight of the master table 210. A nut 220 in threadable engagement with the ball screw 202 is secured to the master table 210 and generates a force to drive it in the Y-axis direction as the Y-axis motor 201 rotates.

The working table 250 around the master table 210 is furnished with four horizontal rollers 251, 252, 253 and 254 that laterally abut against the main rail 170 on the X table 100 to define the direction in which the working table is to slide, and vertical rollers 255, 256, 257 and 258 that abut against the subrails 171 and 172 on the X table 100 from above to support the weight of this working table. The working table 250 resembles a frame in shape having a central opening 260. The working table 250 is furnished with a first AF drive unit 310 on one side in a direction perpendicular to the direction in which the working table slides, and is also furnished with a second and a third AF drive unit 320 and 330 on the other side across the opening 260.

Figure 8:
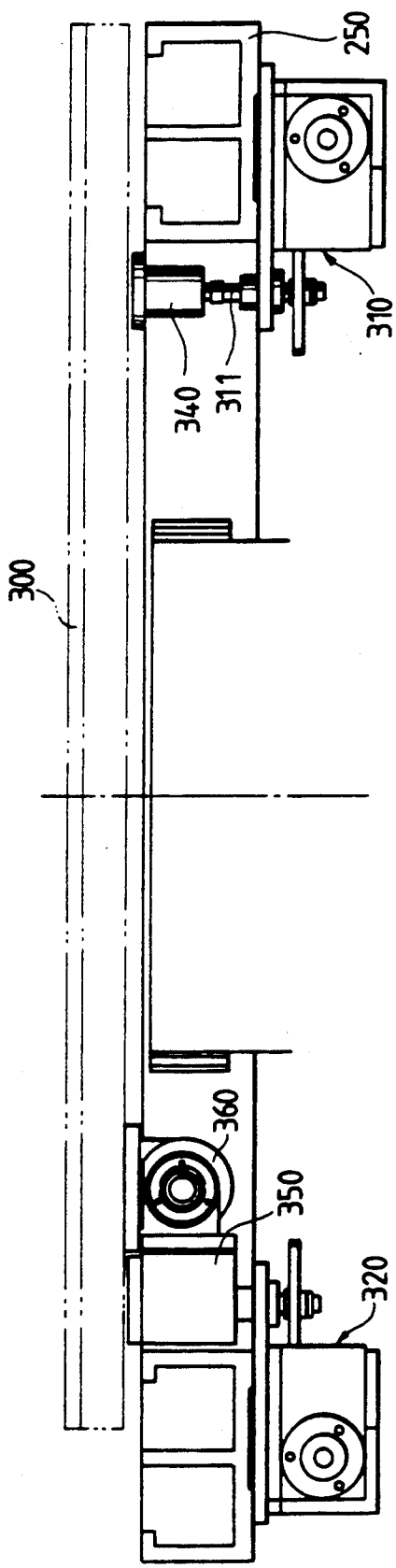
FIG. 8 is a side view of the same Y coordinate table.

As shown in FIG. 8, one side of the drawing board 300 makes contact at a point with the end of a ball screw 311 in the first AF drive unit 310 via a cylindrical abutting member 340, and the other side is swingably mounted, via two bearing members 360, on a vertical moving piece 350 that makes parallel vertical movements by means of the second and third AF drive units 320 and 330 controllable by the same signal. Since the second and third AF drive units are controlled by the same signal, the drawing board will tilt about only one axis. The inclination of the drawing surface can be a problem as long as the direction of main scanning is concerned since this is closely related to the depth of focus of the fη lens. But as for the sub-scanning direction, a certain amount of inclination will not be a problem to a single scan field since it can be eliminated by vertically moving the entire drawing surface subsequent to its sliding.

Figure 9:
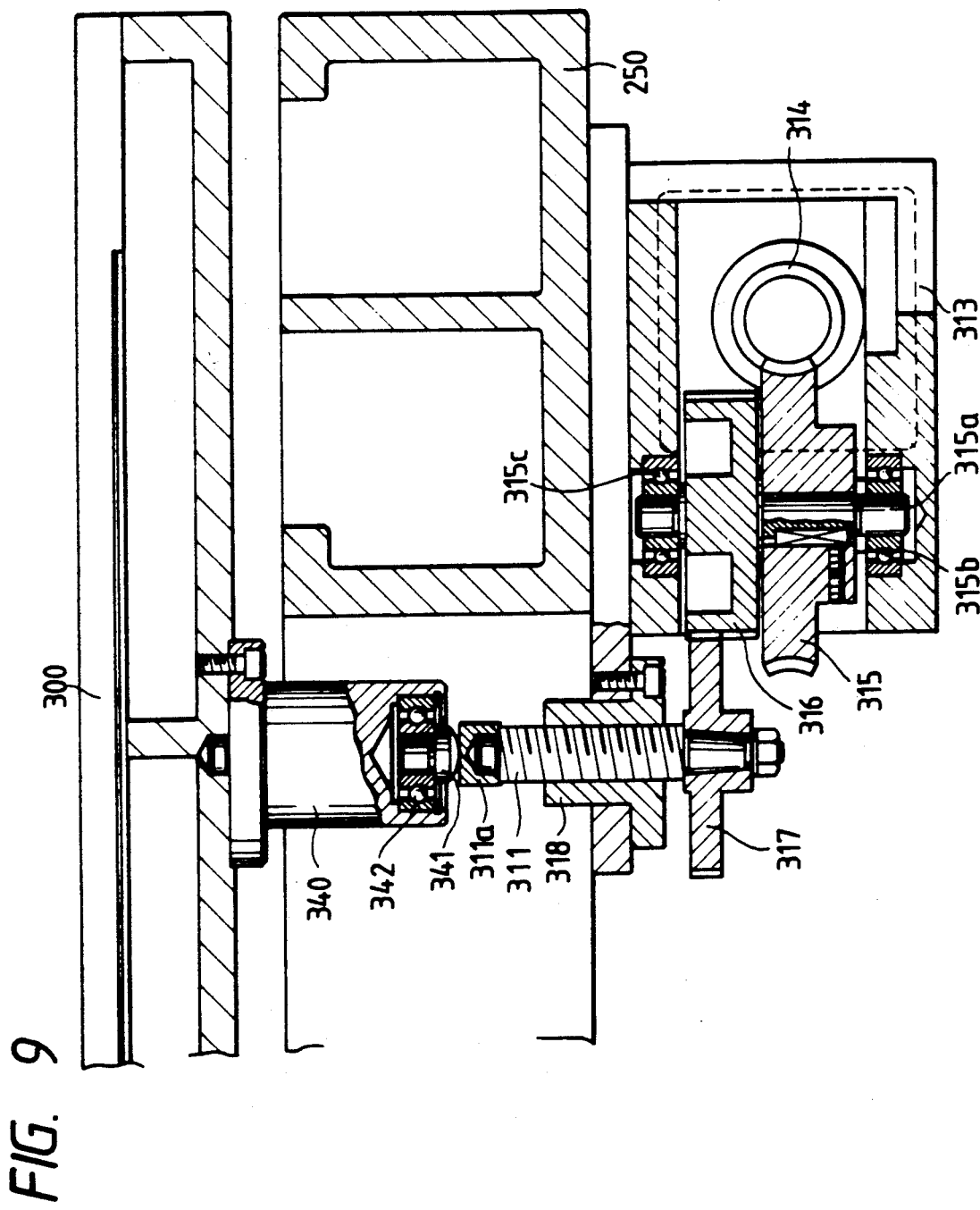
FIG. 9 is a cross section of FIG. 7 as seen looking in the direction indicated by arrows IX.

As shown in FIGS. 7 and 9, the latter being a cross section of FIG. 7 as seen looking in the direction indicated by arrows IX, the first AF drive unit 310 includes a first AC motor 312, a worm gear 314 housed in a gear box 313 and connected to the rotating shaft of the motor via coupling 312a, a worm wheel 315 and a first spur gear 316 that are housed coaxially in the gear box 313, and a second spur gear 317 that is capable of rotation by threadable engagement with the first spur gear 316. A rotating shaft 315a to which the worm wheel 315 and the first spur gear 316 are secured is mounted on the gear box 313 via single-race ball bearings 315b and 315c on opposite ends.

The rotating shaft of the second spur gear 317 is the ball screw 311 mentioned above, which threadably engages a nut 318 fixed to the working table 250. The first spur gear 316 has such a thickness that a clearance is provided both above and below to prevent disengagement from the second spur gear 317 even if it is vertically moved by the action of the ball screw 311. The ball screw 311 has a clip 311a at its end, and a spherical member 341 which is to be contacted by this clip 331a is rotatably mounted on the abutting member 340 by means of a single-race ball bearing 342.

According to the arrangement described above, when the first AC motor 312 is driven, a rotational force is transmitted to the ball screw 311 through the gear trains, and thus one side of the drawing board 300 can be moved vertically in accordance with the amount by which the motor is driven.

Figure 10:
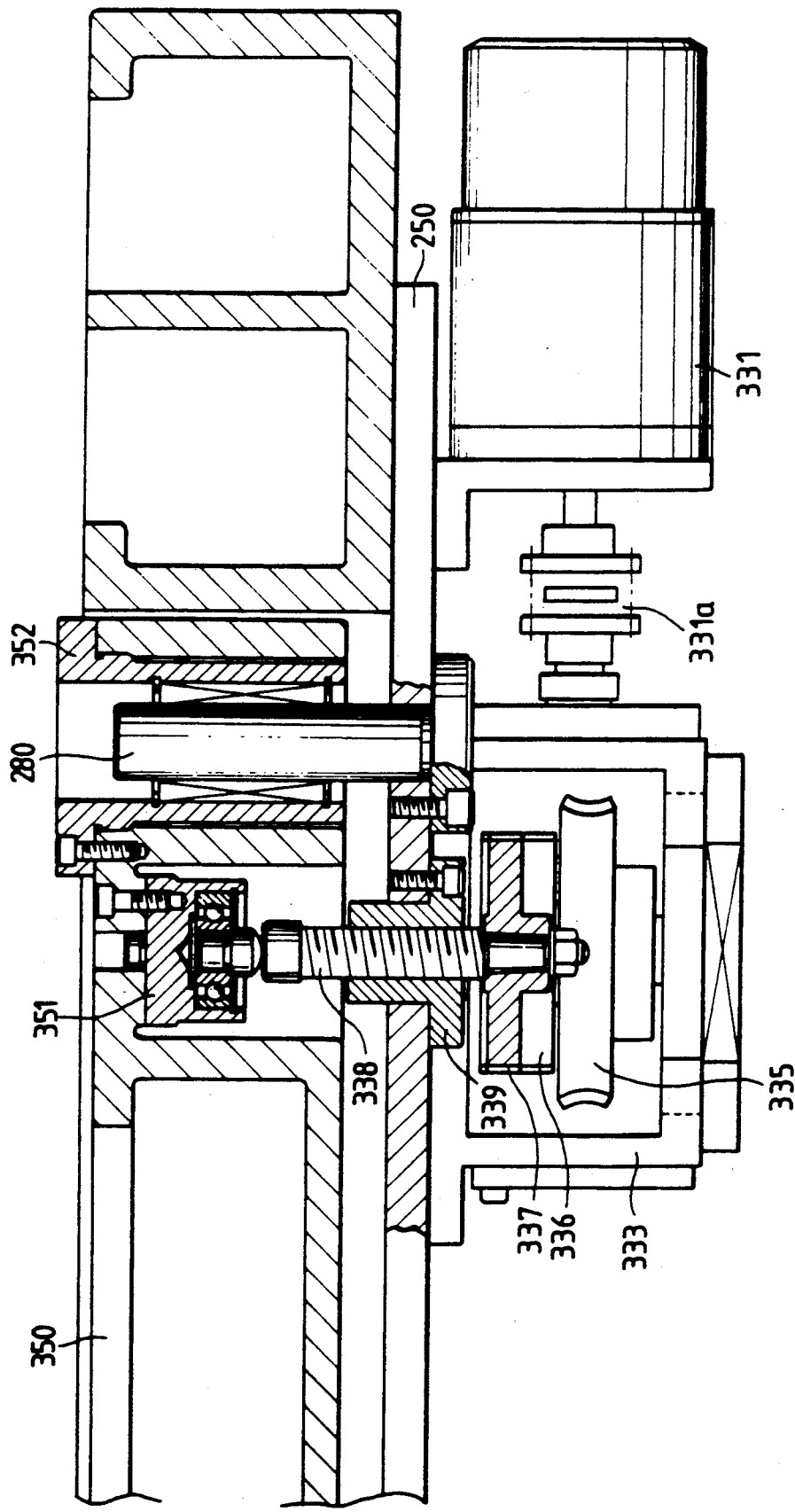
FIG. 10 is a cross section of FIG. 7 as seen looking in the direction indicated by arrows X.

As shown in FIGS. 7 and 10, the latter being a cross section of FIG. 7 as seen looking in the direction indicated by arrows X, the third AF drive unit 330 transmits the drive force from a third AC motor 331 to a worm gear 334 in a gear box 333 via a coupling 331a, thereby rotating both a worm wheel 335 in mesh with this worm gear and a first spur gear 336 which is coaxial with the worm wheel. The third AF drive unit also rotates a second spur gear 336 in mesh with the first spur gear 336, thereby causing vertical movements of a ball screw 336 in threadable engagement with a nut 339. A clip 338a at the end of the ball screw 338 is in contact with a spherical member 351a in an abutting member 351 fixed to the vertical moving piece 350.

Two cylindrical linear bushes 280 project upward from the working table 250 and are slidably inserted into cylinders 352 fixed at opposite ends of the vertical moving piece 350.

The foregoing description of the third AF drive unit applies equally to the second AF drive unit 320. That is, the vertical moving piece 350 moves vertically as guided by the linear bushes when the second and third AC motors are driven.

Figure 11:
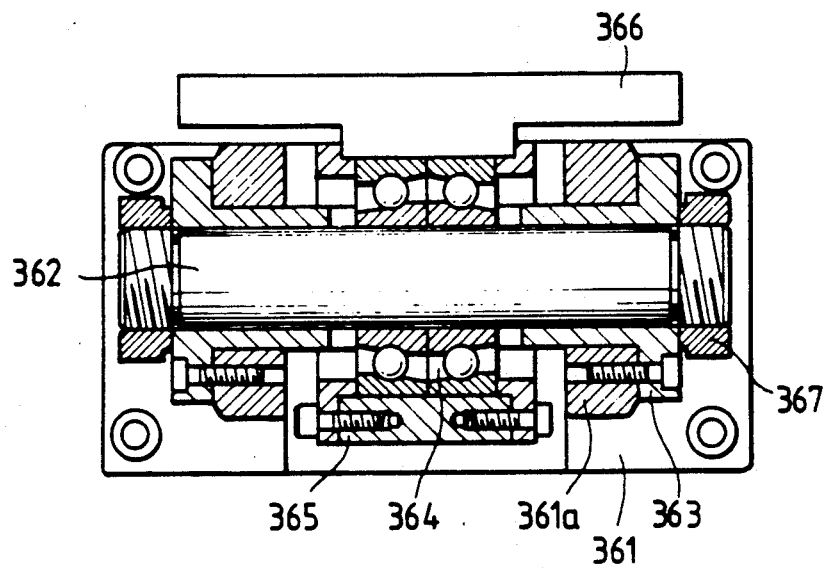
FIG. 11 is a cross section of FIG. 7 as seen looking in the direction indicated by arrows XI.
Figure 12:
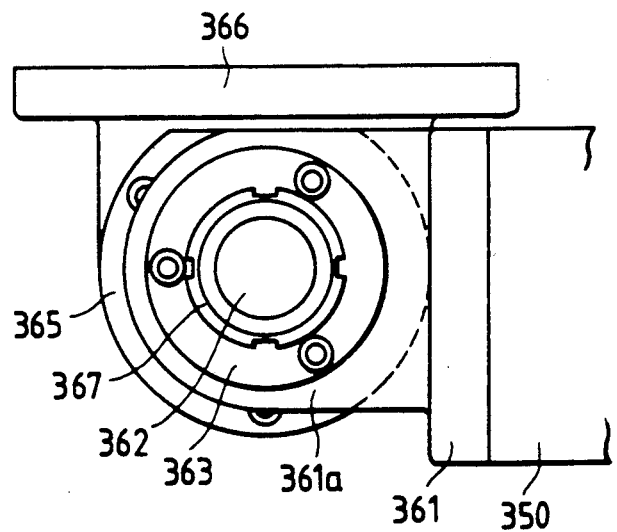
FIG. 12 is a side view of FIG. 11.

The vertical moving piece 350 and the drawing board 300 are connected by the ball bearing members 360 which, as shown in FIG. 11 (a cross section of FIG. 7 as seen looking in the direction indicated by arrows XI) and FIG. 12 (a side view of FIG. 11), are each composed of a plate 361 fixed to the vertical moving piece 350, a support arm 361a extending vertically from fixed plate, a socket 363 that retains a pivotal axis 362 and which is fitted into the support arm 361a, a pivoting member 365 that is pivotally mounted on a rotating axis via a combined angular bearing 364, and a drawing board support 366 that is integral with this pivoting member 365 and to which the drawing board 350 is to be fixed. The pivotal axis 362 is secured by a locking nut 367 at both ends. The arrangement described above insures that the vertical moving piece 350 is coupled to the drawing board 300 in such a manner that the latter is capable of tilting.

The layout of the optical elements used in the embodiment under consideration is described hereinbelow with reference to FIGS. 3 and 13, the latter being a perspective view showing schematically only the optical elements depicted in FIG. 3. Like elements are identified by like reference numerals in the two drawings.

The photoplotter under consideration splits the laser beam from the scanning laser 400 into three beamlets, two of which are used to form two spots on the drawing surface and the remainder is used as monitor light for detecting the exact positions of these spots. In response to the rotation of the polygonal mirror 450, the two spots on the drawing surface scan simultaneously those areas on adjacent scanning lines which are spaced apart in the direction of main scanning. Spacing is provided in the main scanning direction since the distance between adjacent scanning lines is set at a smaller value than the diameter of beam spot in order to insure precise pattern drawing, and unless spacing is provided in the main scanning direction, two spots can partly overlap to introduce instability in the drawing performance by interference.

A polarizing beam splitter which polarizes two light beams in directions that cross each other at right angles is commonly used to synthesize such beams in one optical path. However, if it is desired to divide the beam issuing from a single light source into three parts and recombine them into a single beam so that it can be scanned by the same deflector as in the case described immediately above, the method of performing splitting and synthesizing operations solely on the basis of the direction of polarization is by no means effective.

Figure 13:
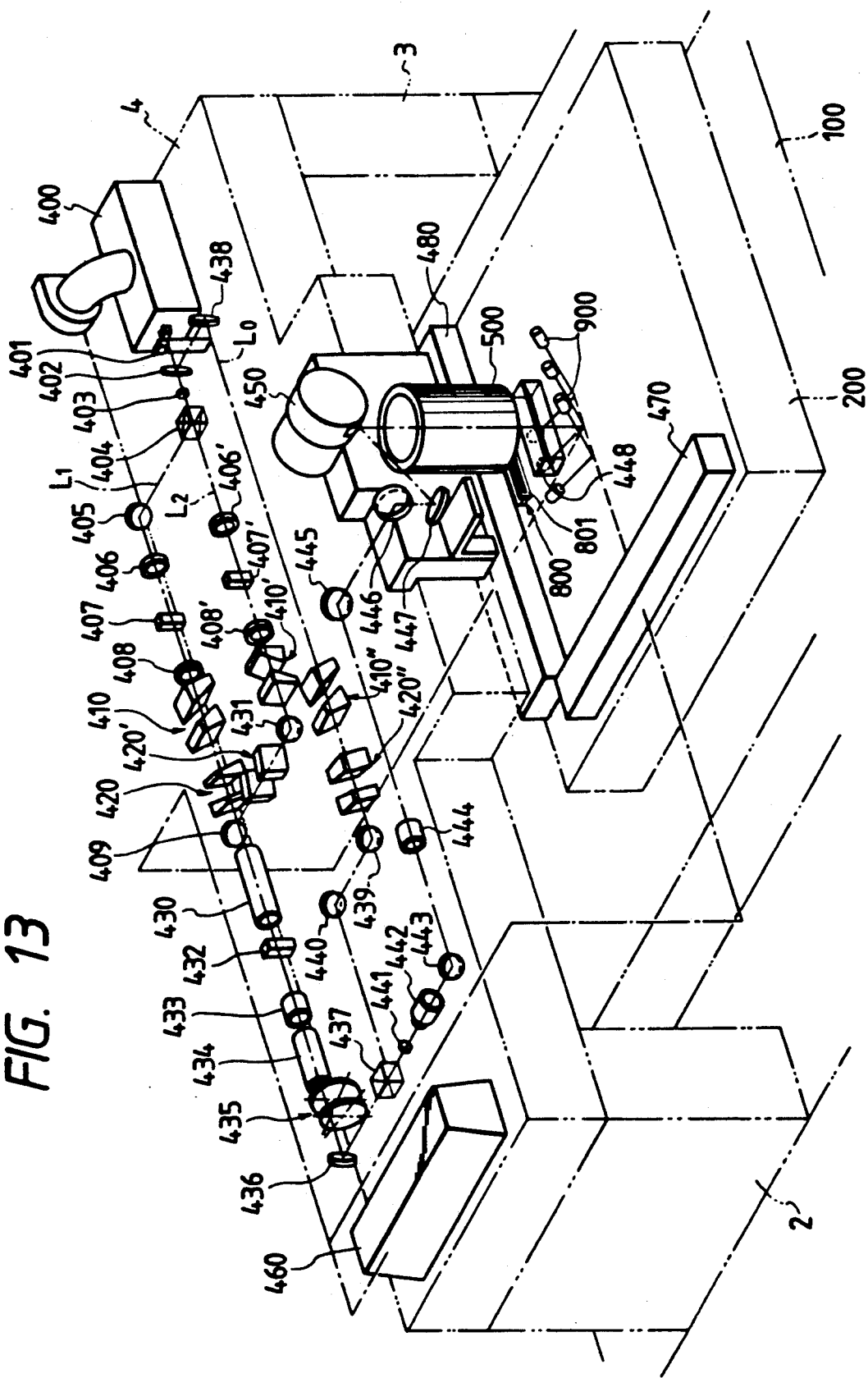
FIG. 13 is a perspective view showing schematically the layout of the optical elements used in the laser photoplotter of FIG. 1.

The optical system shown in FIGS. 3 and 13 uses a special technique to overcome the difficulty described above. According to this technique, pattern drawing light beams are distinguished from a monitor beam by making use of polarization, and the two pattern drawing beams are directed to the same lens but in different directions so as to synthesize them in the same optical path. This method of synthesis is permissible since, as already mentioned, pattern drawing spots are formed in areas that are spaced in the direction of main scanning.

Laser light issuing from the scanning laser 400 passes through a shutter 401 and is divided into two parts by passage through a 5% reflecting half-silvered mirror 402. The laser light reflected from this half-silvered mirror 402 is used as monitor light L0. Laser light transmitted by the half-silvered mirror 402 has its direction of polarization rotated through 90° by means of a first half-wavelength plate 403 so that it will be directed toward an acousto-optical (AO) modulator (ultrasonic optical modulator) as an S-polarized component. This light is further divided into parts by a first beam splitter 404 capable of 50% reflection (i.e., 50% transmission). The resulting two beamlets are used as pattern drawing light for forming two spaced spots on the drawing surface.

A first pattern drawing beamlet L1 reflected from the first beam splitter 404 is further reflected by a beam bender 405 and condensed by a lens 406 to converge at the position of a first pattern drawing AO modulator 407. The AO modulator 407 receives laser light incident in a direction that satisfies the Bragg condition and diffracts this incident light in response to an ultrasonic electric input signal into the transducer. By turning on and off the ultrasonic input, the laser light launched into the AO modulator 407 can be changed from light of the zero-th order to light of the first order (primary light) and vice versa, and the primary light is used as a pattern drawing beams. The AO modulator 407 is controlled by a WRITE signal containing information as to dot exposure to be performed on the drawing surface.

The modulated ON light (primary light) is collimated by a lens 408 behind the AO modulator 407 and the resulting parallel beam is deflected through a predetermined angle as it passes through a first and a second unit 410 and 420 for fine tuning the optical axis, each of the units 410 and 420 being composed of two prisms. The deflected light is directed to a first lens unit 430 after traveling very close to the edge of a beam bender 409.

A second pattern drawing beamlet L2 transmitted by the first beam splitter 404 is converged by passage through a lens 406' and directed into a second pattern drawing AO modulator 407'. The function of the AO modulator 407' is the same as that of the first pattern drawing AO modulator 407 except that it is driven by a signal for scanning one line away from the line to be scanned by the input signal to the first pattern drawing AO modulator 407.

The primary light emerging from the second pattern drawing AO modulator 407' is passed through a lens 408' and deflected by a predetermined angle as it passes through a third unit 410' for fine tuning the optical axis, a beam bender 431, and a fourth unit 420' for fine tuning the optical axis. Each of the axis tuning units 410' and 420' is composed of two prisms. The deflected primary light is reflected by the edge of the beam bender 409 and launched into the first lens unit 430.

The lenses 406 and 406' have compositions shown in Table 1 below, and the lenses 408 and 408' have compositions shown in Table 2 below. In these tables, f signifies the focal length of the lens, $r_i$, the radius of curvature of the i-th surface, $d_i$, the distance (lens thickness or aerial distance) between the i-th and (i+1)-th surfaces, and $n_i$, the refractive index of the medium between the i-th and (i+1)-th surfaces at the operating wavelength.

In order to separate a plurality of spots on the image plane by small amounts while ensuring high convergence of each spot, the scanning light beams must be synthesized at the same position on the deflector in such a way that they have sufficiently small angles. To this end, fine setting and adjustment of both angle and position are necessary. Particularly close tolerances must be met in the angular direction since an error in that direction is multiplied on the image plane. Satisfactory precision cannot be attained by adjustment with mirrors.

Thus, as already described above, two units for fine tuning the optical axis are provided for each optical path in the system under consideration for the purpose of adjusting the direction of light beams and the amount of their shift in small pitches. For the same reason, a fifth and a sixth units 410" and 420" for fine adjusting the optical axis are provided for the monitor light L0.

Figure 14:
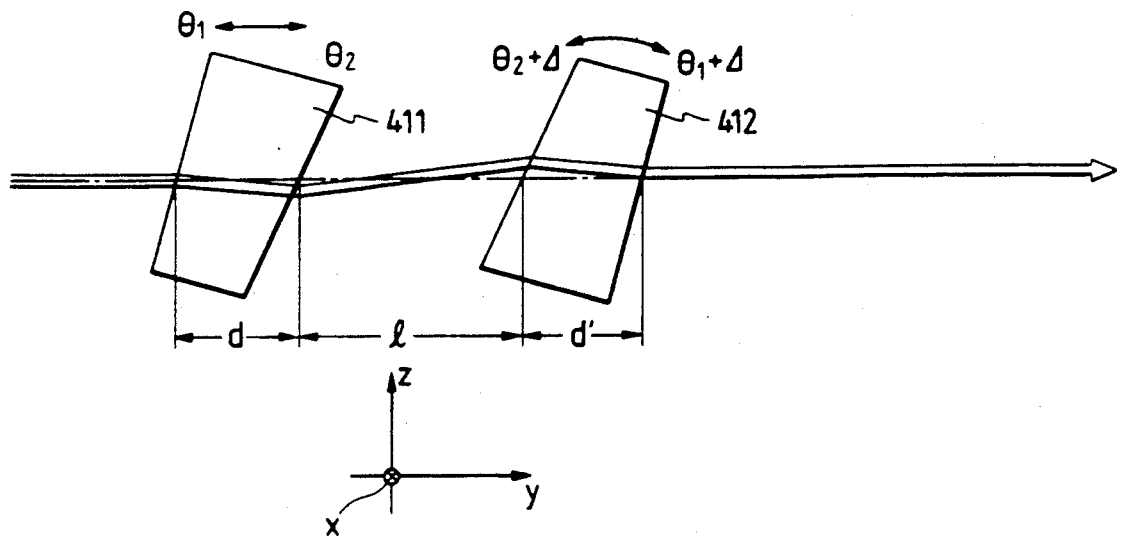
FIGS. 14 and 15 are illustrations showing the layout of prisms that may be used in the above embodiment of the present invention.
Figure 15:
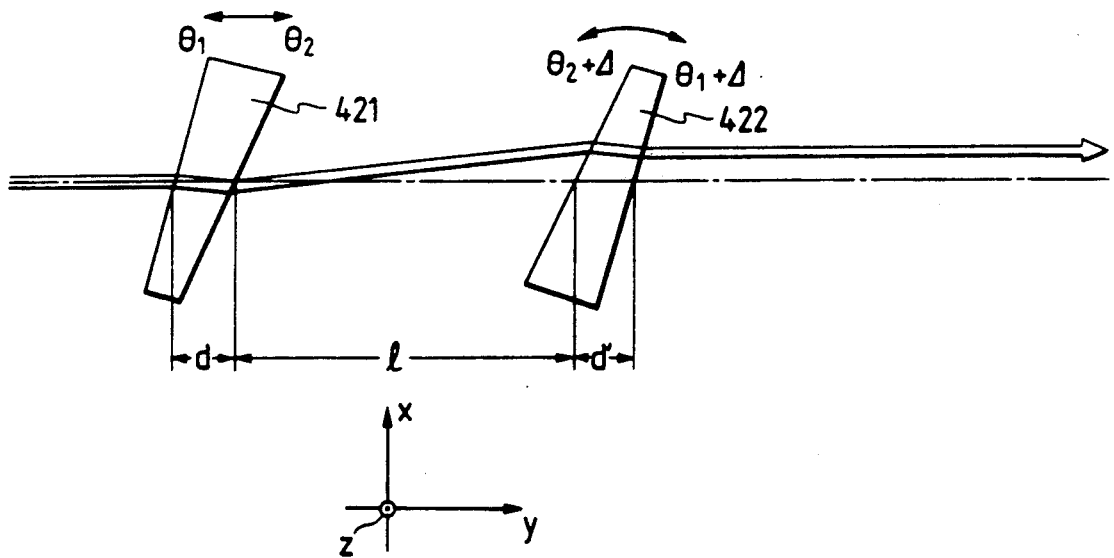

The first and second prisms 411 and 412 in the first tuning unit 410 have the composition shown in FIG. 14 and Table 3, whereas the first and second prisms 421 and 422 in the second tuning unit 420 have the composition shown in FIG. 15 and Table 4. FIG. 14 is a cross section of the optical head unit 4 taken through the X-Z plane perpendicular to the top of the head unit, and FIG. 15 is a cross section of the same head unit taken through the X-Y plane parallel to its top. The prisms in the first optical axis tuning unit 410 are not inclined to the direction of incident light in the X-Y plane and hence will take no part in deflection in this plane. Similarly, the prisms in the second optical axis tuning unit 420 take no part in deflection in the Y-Z plane.

In order to ensure that the prisms will satisfy the settings shown in FIGS. 14 and 15 and in Tables 3 and 4, the first prism 411 in the first optical axis tuning unit 410 is made slidably adjustable in the direction of the optical axis and the second prism 412 is made pivotally adjustable about the pivotal axis parallel to the X axis. Further, the first prism 421 in the second optical axis tuning unit 420 is made slidably adjustable in the direction of the optical axis and the second prism 422 is made pivotally adjustable about the pivotal axis parallel to the Z axis. Details of the mechanisms for effecting the necessary adjustments will be described below. In the example at hand, the first and second pattern drawing light beams L1 and L2 are oriented so that their central axes form an angle of 0.27° in the direction of main scanning and an angle of 0.034° in the sub-scanning direction, and so that they are directed toward the first lens unit 430 from a position distant by 3.8 mm and 0.48 mm in the main and sub-scanning directions, respectively.

The first lens unit 430 which admits the light beams reflected from the tuning units 420 and 420' is a positive lens unit composed of a positive, a negative and a position element as shown in Table 5. This lens unit converges the incident laser light. A compensating AO modulator 432 which compensates for the effect caused by the tilting of the polygonal mirror 450 is provided ahead of the point of condensation by the first lens unit 430 as spaced by an aerial distance of 62 mm.

The pattern drawing laser light issuing from the compensating AO modulator 432 passes through a relay lens unit composed of a positive and a negative element as shown in Table 6 and is thereafter directed toward a second lens unit 434 composed of a negative and a positive element as shown in Table 7.

The amplitude of the pattern drawing laser light collimated again by the second lens unit 434 is adjusted by a variable filter unit 435 and the light is reflected from a beam bender 436 to enter a first polarizing beam splitter 437 where it is combined with the monitor light. The monitor light which was reflected from the half-silvered mirror 402 is further reflected by a beam bender 438 and deflected a predetermined angle by the fifth and sixth optical axis tuning units 410" and 420". The deflected light is reflected from beam benders 439 and 440 and directed as an S-polarized component to the first polarizing beam splitter 437 for reflection.

The two pattern drawing beams are polarized by the first half-wavelength plate 403 for a different direction than the monitor light and are directed as a P-polarized component to the first polarizing beam splitter 437 for transmission.

The two pattern drawing beams and the monitor beam have their polarizing direction rotated through 90° by a second half-wavelength plate 441 and are passed successively through a third lens unit 442 composed of a negative, a positive, a negative and a positive element as shown in Table 8, a beam bender 443 and a fourth lens unit 444 composed of two positive elements, as indicated in Table 9. The beams emerging from the fourth lens unit 444 are passed through three beam benders 445, 446 and 447 and directed toward the polygonal mirror 450 by which they are reflected and deflected.

The first and second lens units 430 and 434 form a first beam expander unit capable of ×1.67 magnification, which enlarges a beam of $0.7^\phi$ to $1.17^\phi$. The third and fourth lens units 442 and 444 form a second beam expander unit capable of ×21.4 magnification which enlarges the two pattern drawing beams from a spot of $1.17^\phi$ to $25^\phi$.

The relay lens unit 433 takes no part in the magnifications of these beam expander units; instead it renders the compensating AO modulator 432 conjugative with the reflecting surfaces of the polygonal mirror 450 and compensates not only for the tilting of the polygonal mirror but also for any consequent beam shift that occurs on the polygonal mirror.

The reflecting surfaces of the polygonal mirror 450 are subject to a tilting error, i.e., an inclination to the axis of rotation, on account of machining error or some other factor, and each time a different reflecting surface is used the scanning line will deviate in the direction of sub-scanning, which is normal to the direction of scanning by a beam spot. If an AO modulator is merely provided between the light source and the deflector to effect fine deflection of the angle of incidence in the sub-scanning direction, the angular deviation of incident light due to tilting can be corrected, but then a lateral shift occurs in the reflected light. This lateral shift will cause the incident light on the $f\theta$ lens to deviate in the sub-scanning direction and problems may arise such as deterioration of lens performance, curvature of the scanning line, and even occasional vignetting by the lens barrel.

In order to avoid these problems, the compensating AO modulator 432 and the polygonal mirror 450 in the system under consideration are designed to be optically conjugative to each other. The term "optically conjugative" does not necessarily mean that the two devices satisfy an "imaging" relationship, but it is to be understood that as far as the principal rays are concerned, an angular deviation of light will not result in positional deviation.

The reflected beams from the polygonal mirror 450 are converged by the fθ lens 500 with a focal length of 151 mm, as specified in Table 10. The pattern drawing beams are transmitted by a second polarizing beam splitter 448 to form two spots with a diameter of 5 μm on the drawing surface. These two spots are spaced apart by a distance of 20 μm in the main scanning direction and by 2.5 μm in the sub-scanning direction, the latter being equal to the inter-line gap.

The monitor light which is directed as an S-polarized component to the beam splitter 448 is reflected therefrom and directed toward a monitor detecting unit 800 having a scale 801 for scan correction. As will be described below, the monitor detecting unit 800 detects the change in the amount of transmission of the beam which scans the scale 801 and outputs a pulse having a frequency proportional to the scan speed.

Reference numeral 900 denotes a focus detecting mechanism composed of three pairs of light-emitting light-detecting elements. As will be described hereinafter, this mechanism detects the reflected light from the drawing surface and determines if it is within the depth of focus of the fθ lens 500.

TABLE 1

| Lenses 406 and 406' (each composed of a single element) f = 130.02 | | | |
|---|---|---|---|
| i | $r_i$ | $d_i$ | $n_i$ |
| 1 | 98.137 | 3.60 | 1.80593 |
| 2 | 1520.979 | | |

The aerial distance from the second surface of each lens to the surface of the associated pattern drawing AO modulator is 127.89.

TABLE 2

| Lenses 408 and 408' (each composed of a single element) f = 130.02 | | | |
|---|---|---|---|
| i | $r_i$ | $d_i$ | $n_i$ |
| 1 | −1520.979 | 3.60 | 1.80593 |
| 2 | −98.137 | | |

The aerial distance from the pattern drawing AO modulator to the first surface of each lens is 127.89.

TABLE 3

| First optical axis tuning unit 410 (two-unit-two-element) | | | | |
|---|---|---|---|---|
| i | $r_i$ | $d_i$ | $n_i$ | main scanning angle | sub-scanning angle |
| 1 | ∞ | 10.00 | 1.52177 | 0° | −15.00° |
| 2 | ∞ | 18.86 | | 0° | −25.00° |
| 3 | ∞ | 10.00 | 1.52177 | 0° | −25.24° |
| 4 | ∞ | | | 0° | −15.24° |

The aerial distance from the second surface of lens 408 to the first surface of the tuning unit is 93.93.

TABLE 4

| Second optical axis tuning unit 420 (two-unit-two-element) | | | | |
|---|---|---|---|---|
| i | $r_i$ | $d_i$ | $n_i$ | main scanning angle | sub-scanning angle |
| 1 | ∞ | 5.00 | 1.52177 | −15.00° | 0° |
| 2 | ∞ | 28.39 | | −25.00° | 0° |
| 3 | ∞ | 5.00 | 1.52177 | −26.82° | 0° |
| 4 | ∞ | | | −16.82° | 0° |

The aerial distance from the fourth surface of the first tuning unit 410 to the first surface of the second tuning unit 420 is 120.00.

TABLE 5

| First lens unit 430 (three-unit-three-element) f = 179.99 | | | |
|---|---|---|---|
| i | $r_i$ | $d_i$ | $n_i$ |
| 1 | 94.500 | 5.74 | 1.80593 |
| 2 | ∞ | 70.14 | |
| 3 | −40.350 | 5.52 | 1.80593 |
| 4 | 67.500 | 82.41 | |
| 5 | 117.000 | 5.15 | 1.80593 |
| 6 | −117.000 | | |

The aerial distance from the fourth surface of the second tuning unit 420 to the first surface of the first lens unit 420 is 150.00, the aerial distance from the sixth surface of the first lens unit 420 to the compensating AO modulator 432 is 54.67, and the aerial distance from the point of condensation by the first lens unit to the modulating surface is 61.95.

TABLE 6

| Relay lens unit 433 (two-unit-two-element) f = 56.18 | | | |
|---|---|---|---|
| i | $r_i$ | $d_i$ | $n_i$ |
| 1 | 36.000 | 5.00 | 1.80593 |
| 2 | −68.000 | 19.23 | |
| 3 | −26.650 | 5.00 | 1.80593 |
| 4 | 26.650 | | |

The aerial distance from the modulating surface of the compensating AO modulator to the first surface of the relay lens unit is 140.38.

TABLE 7

| Second lens unit 434 (two-unit-two element) f = 299.99 | | | |
|---|---|---|---|
| i | $r_i$ | $d_i$ | $n_i$ |
| 1 | −242.198 | 2.50 | 1.80593 |
| 2 | 271.441 | 98.92 | |
| 3 | 780.744 | 4.60 | 1.80593 |
| 4 | −166.058 | | |

The aerial distance between the fourth surface of the relay lens unit and the first surface of the second lens unit is 76.55.

TABLE 8

| Third lens unit (four-unit-four-element) f = −16.16 | | | |
|---|---|---|---|
| i | $r_i$ | $d_i$ | $n_i$ |
| 1 | −12.181 | 2.86 | 1.66091 |
| 2 | 353.663 | 3.71 | |
| 3 | −83.000 | 4.82 | 1.66091 |
| 4 | −29.440 | 29.30 | |
| 5 | 77.394 | 5.02 | 1.68718 |
| 6 | −480.000 | 2.23 | |
| 7 | 488.111 | 3.44 | 1.68718 |
| 8 | 30.000 | | |

The aerial distance between the fourth surface of the second lens unit 434 and the first surface of the third lens unit 442 is 317.00.

TABLE 9

Fourth lens unit 444 (two-unit-two-element)
f = 346.22

| i | $r_i$ | $d_i$ | $n_i$ |
|---|---|---|---|
| 1 | −238.573 | 4.61 | 1.63182 |
| 2 | −167.164 | 2.21 | |
| 3 | ∞ | 5.00 | 1.63182 |
| 4 | −365.980 | | |

The aerial distance between the eighth surface of the third lens unit 442 and the first surface of the fourth lens unit 444 is 296.94, and the aerial distance from the fourth surface of the fourth lens unit 444 to the polygonal mirror is 1261.00.

TABLE 10 fθ lens
F/number = 6.0; f = 151.207; 2θ = 40°
Position of pupil: 94.030 mm ahead of the first surface

| i | $r_i$ | $d_i$ | $n_i$ |
|---|---|---|---|
| 1 | −63.450 | 14.000 | 1.80593 |
| 2 | −155.860 | 6.830 | |
| 3 | −155.000 | 24.750 | 1.80593 |
| 4 | −96.016 | 1.540 | |
| 5 | −487.370 | 21.700 | 1.80593 |
| 6 | −192.980 | 1.500 | |
| 7 | 684.351 | 20.200 | 1.80593 |
| 8 | −684.351 | 1.500 | |
| 9 | 200.000 | 22.400 | 1.80593 |
| 10 | 312.400 | 24.400 | |
| 11 | 173.534 | 30.000 | 1.80593 |
| 12 | 126.660 | 24.000 | |
| 13 | ∞ | 28.000 | 1.79807 |
| 14 | ∞ | | |

The compositions of the optical axis tuning units are hereunder described with reference to FIGS. 16 to 23. For the sake of convenience, the following description is limited to the first and second tuning units but it should be understood that the other tuning units have the same composition except for the direction in which prisms are oriented.

Figure 16:
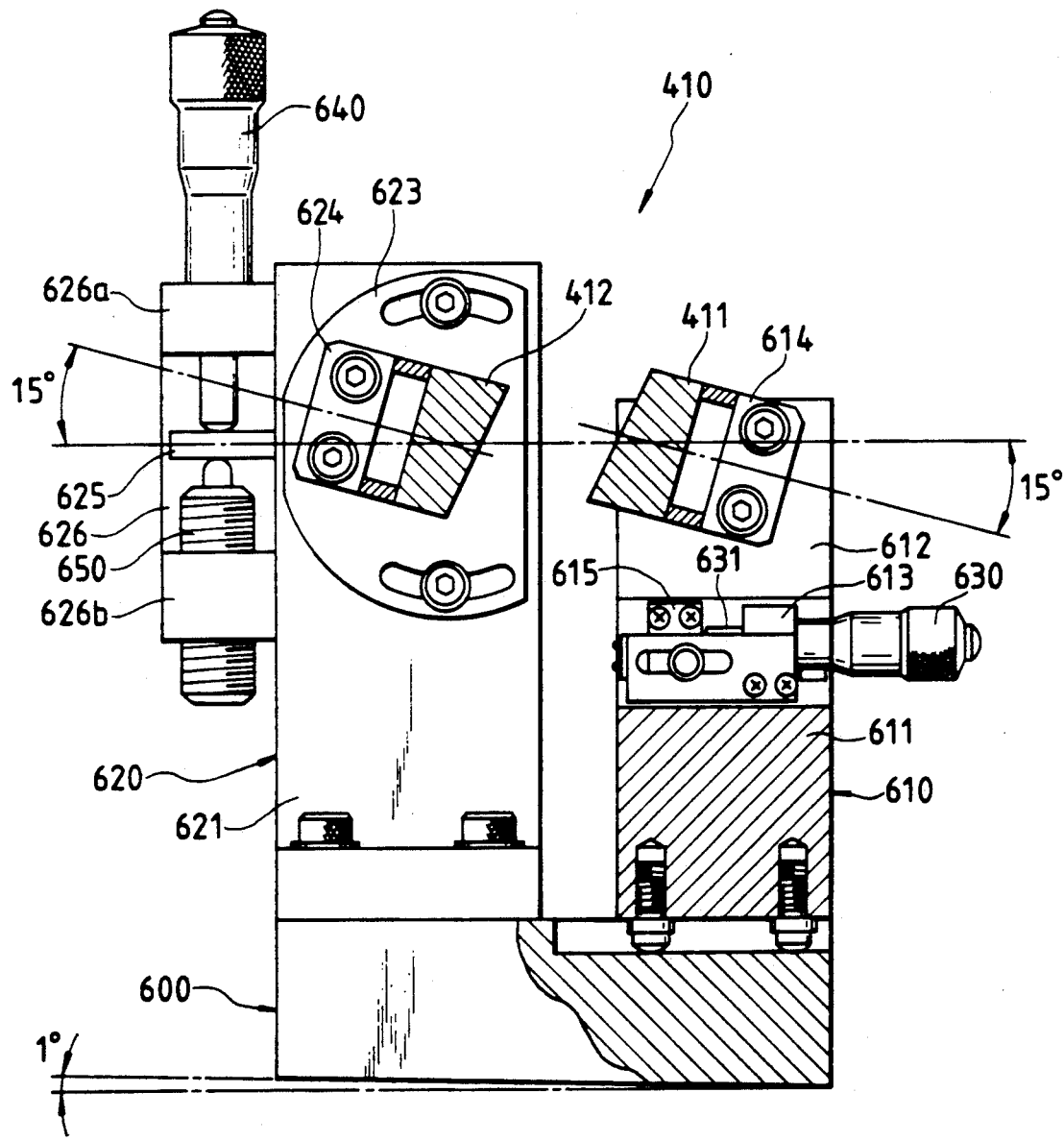
FIG. 16 is a partial fragmentary side view showing the mechanical part of the first unit for effecting fine adjustment of the optical axis as used in the above embodiment of the present invention.
Figure 17:
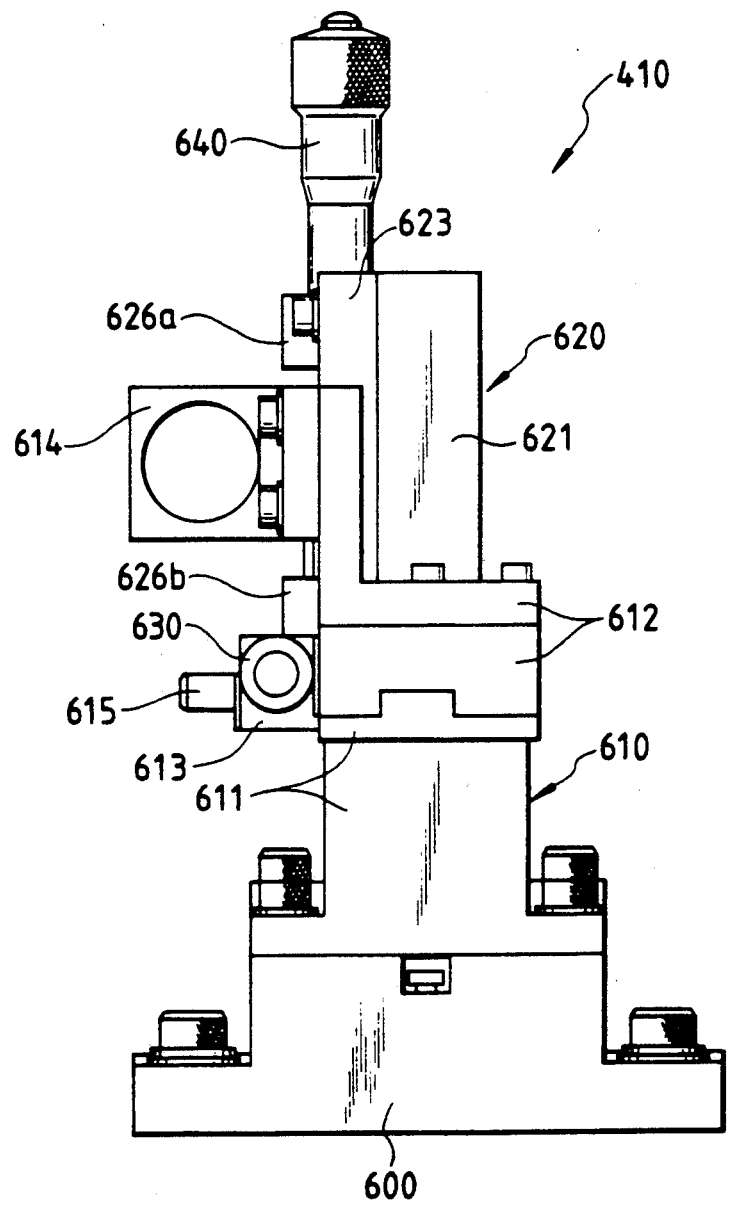
FIG. 17 is a front view of the mechanical part.
Figure 18:
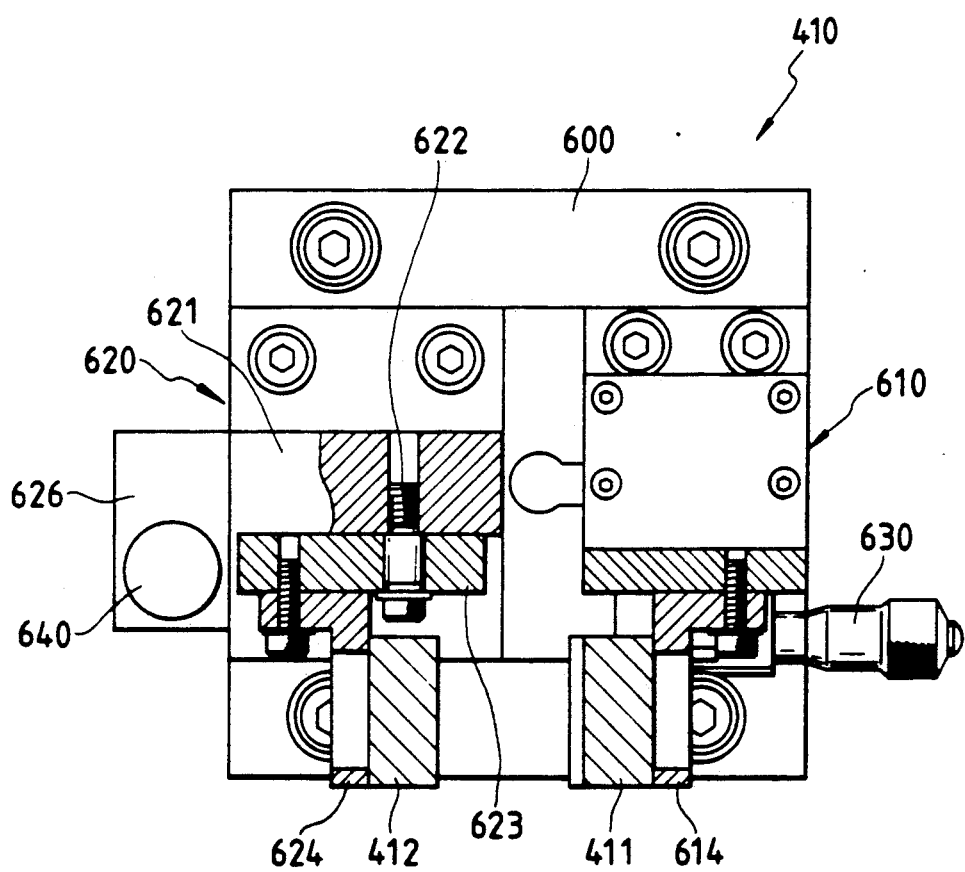
FIG. 18 is a partial fragmentary plan view of the mechanical part.

FIGS. 16 to 18 show the first optical axis tuning unit 410. As shown in FIG. 16, this tuning unit has a base 600 bolted to the optical head unit 4, a slidable adjusting unit 610 which is secured to the base 600 and equipped with the first prism 411, and a pivotal adjusting unit 620 which is equipped with the second prism 412.

As shown in FIG. 17, the slidable adjusting unit 610 is composed of a fixed part 611 which is fixed to the base 600 and a movable part 612 which is adapted to be slidable in the direction of the optical axis by means of the guide rail mechanism in the fixed part. The fixed part 611 has a micrometer head 630 for slidable adjustment that is secured thereto via a holder 613. As shown in FIG. 18, the movable part 612 has a hole that serves as an optical path in which is secured a metal member 614 having an L-shaped cross section and which has the first prism 411 bonded thereto. The movable part 612 also has a guide member 615 as an integral member that is secured at such a position that it faces the micrometer head 630.

The movable part 612 is urged by an internal spring toward the left side as viewed in FIG. 16 and the front end of the spindle 631 of the micrometer head 630 is pushed against the guide member 615. Hence, the movable unit 612 can be slidably adjusted in the direction of the optical axis by pivotally adjusting the micrometer head 630. After adjustment to a predetermined position, the bolts are tightened to secure the movable part 612 to the fixed part 611.

The pivotal adjusting unit 620 has a fixed part 621 which is bolted to the base 600 and a rotating stage 623 that is mounted on the fixed part 621 in such a way that it is pivotable about a pivotal axis 622 (see FIG. 18) positioned at the center of the second prism 412. The rotating stage 623 has secured thereto a metal member 624 that has an L-shaped cross section and to which the second prism 412 is bonded. Further, the rotating stage 623 has a bar 625 that projects from one end and which rotates together with this stage.

Figure 19:
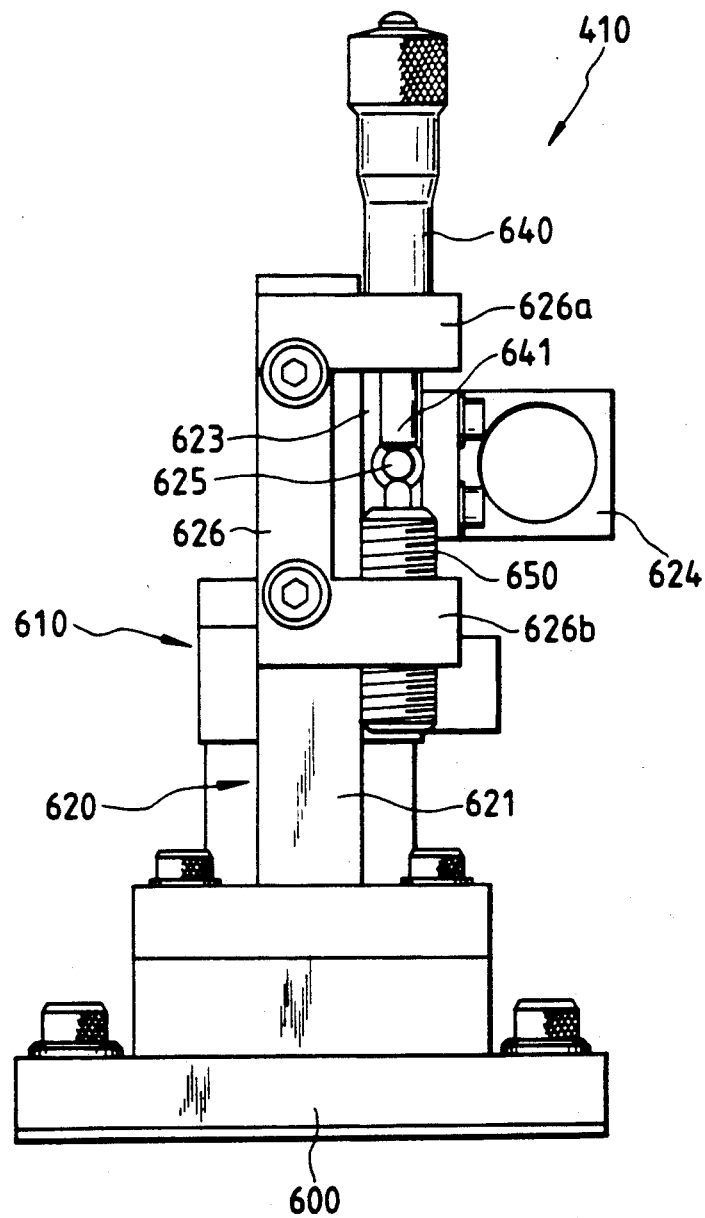
FIG. 19 is a rear view of the mechanical part.

The fixed part 621 has a retaining member 626 secured to one of its end faces, and this retaining member has a U-shaped cross section as shown in FIG. 19. The upper arm 626a of the retaining member 626 is furnished with a micrometer head 640 for pivotal adjustment, and its lower arm 626b is furnished with a spring plunger 650 which faces the micrometer head 640.

The bar 625 projecting from the rotating stage 623 is held between the front end of the spindle 641 of the micrometer head 640 and the spring plunger 650, and the angle of inclination of the second prism 412 can be set to a desired value by adjusting the micrometer head 640. After adjusting the inclination of the second prism to the settings shown in FIG. 14 and Table 3, the rotating stage 623 is secured to the fixed part 621 with bolts.

Figure 20:
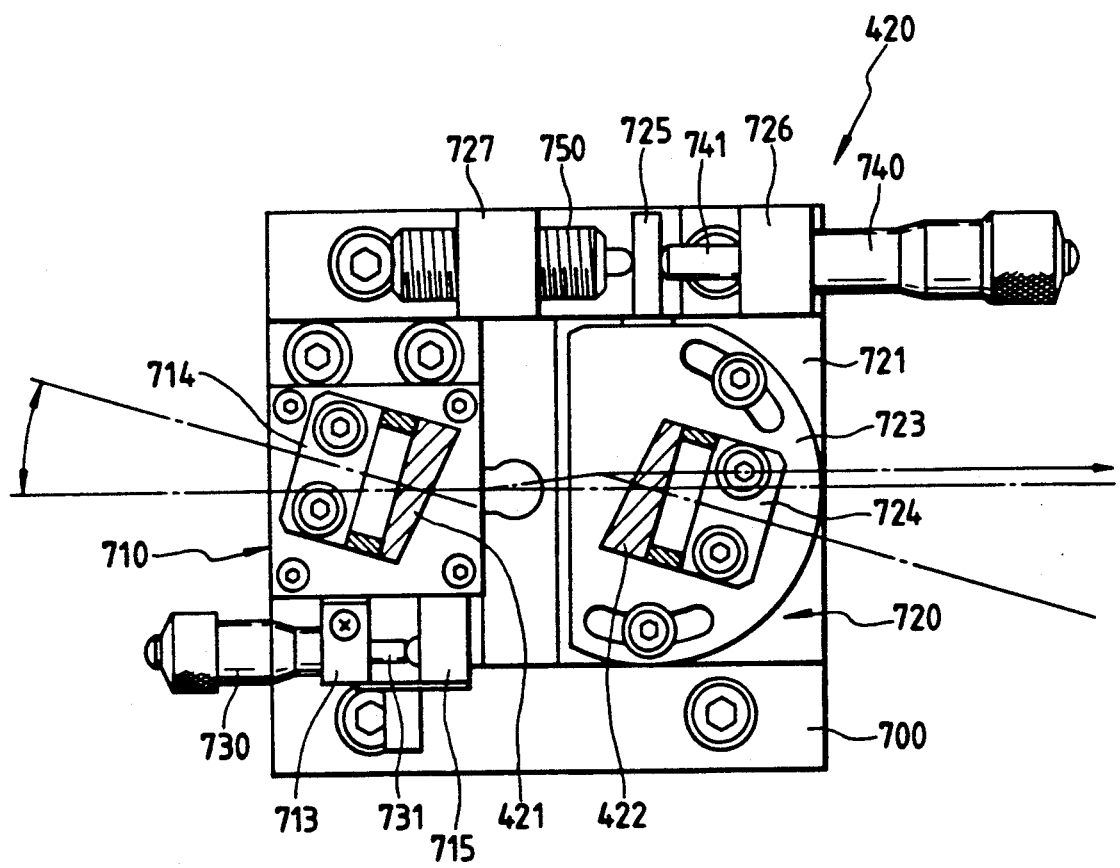
FIG. 20 is a partial fragmentary plan view showing the mechanical part of the second unit for effecting fine adjustment of the optical axis as used in the above embodiment of the present invention.

FIGS. 20 to 23 show the second optical axis tuning unit 420. As shown in FIG. 20 this tuning unit has a base 700 bolted to the optical head unit 4, a slidable adjusting unit 710 which is secured to the base 700 and equipped with the first prism 421, and a pivotal adjusting unit 720 which is equipped with the second prism 422.

Figure 21:
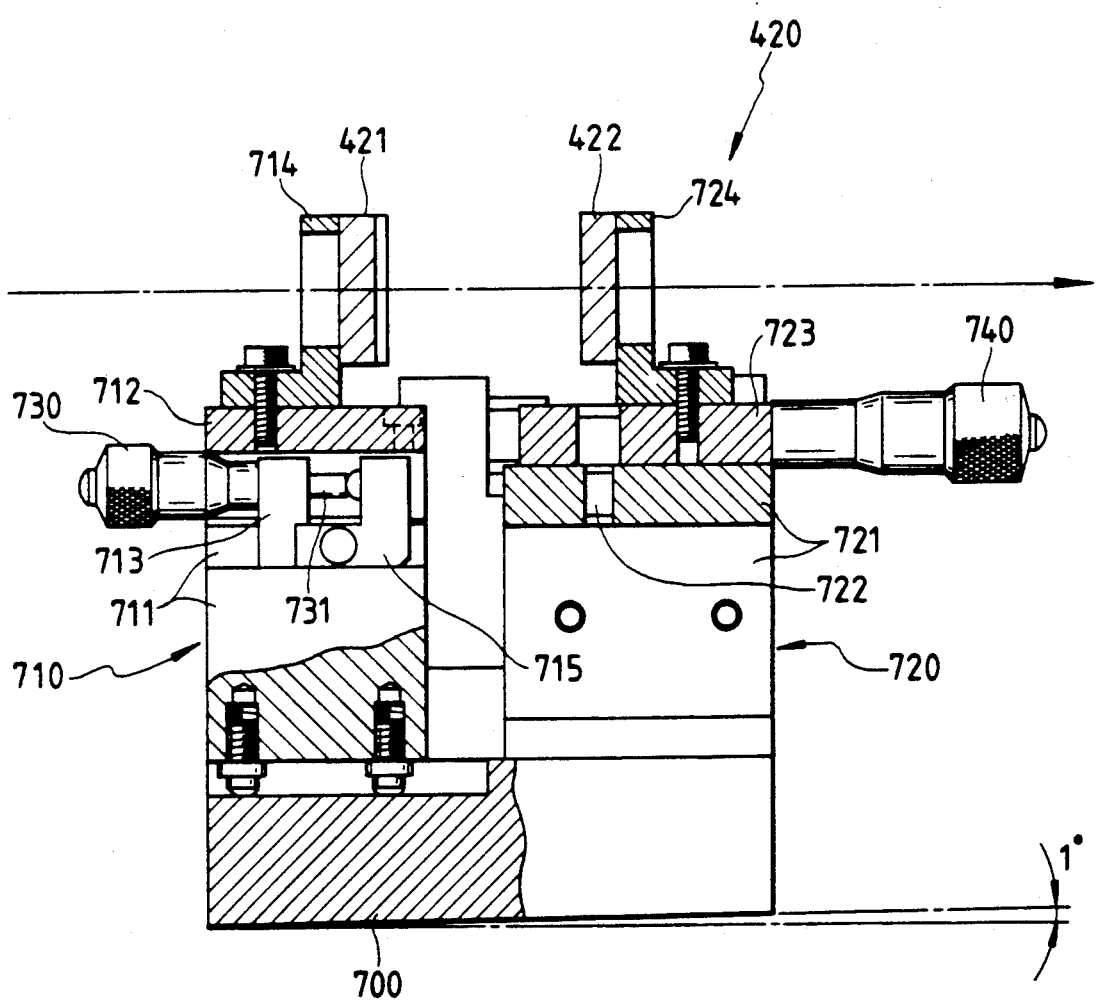
FIG. 21 is a partially cut away side view of the mechanical part.
Figure 22:
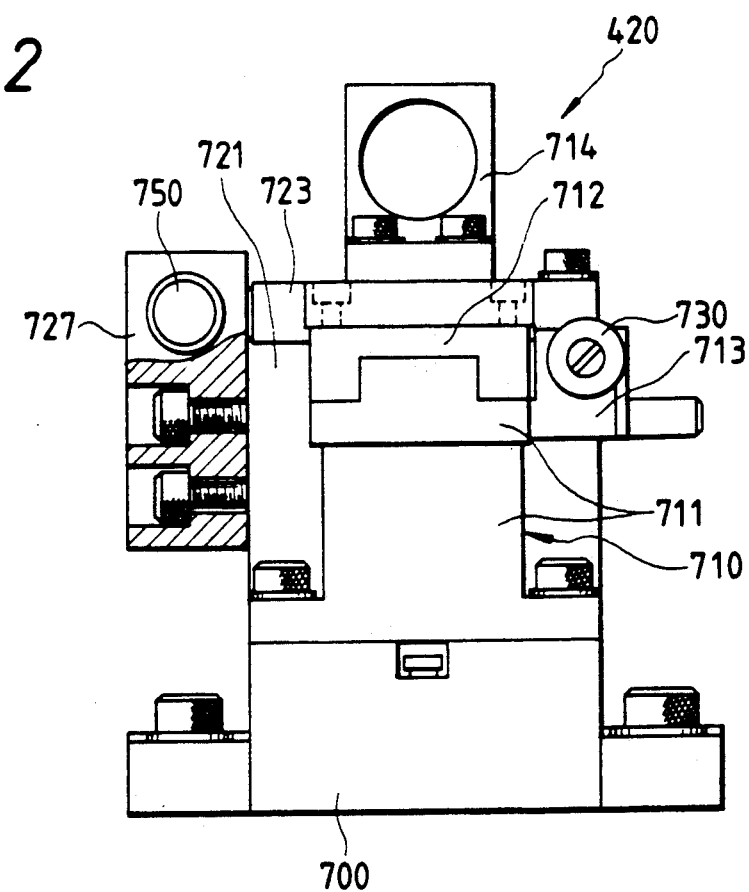
FIG. 22 is a partial fragmentary front view of the mechanical part.
Figure 23:
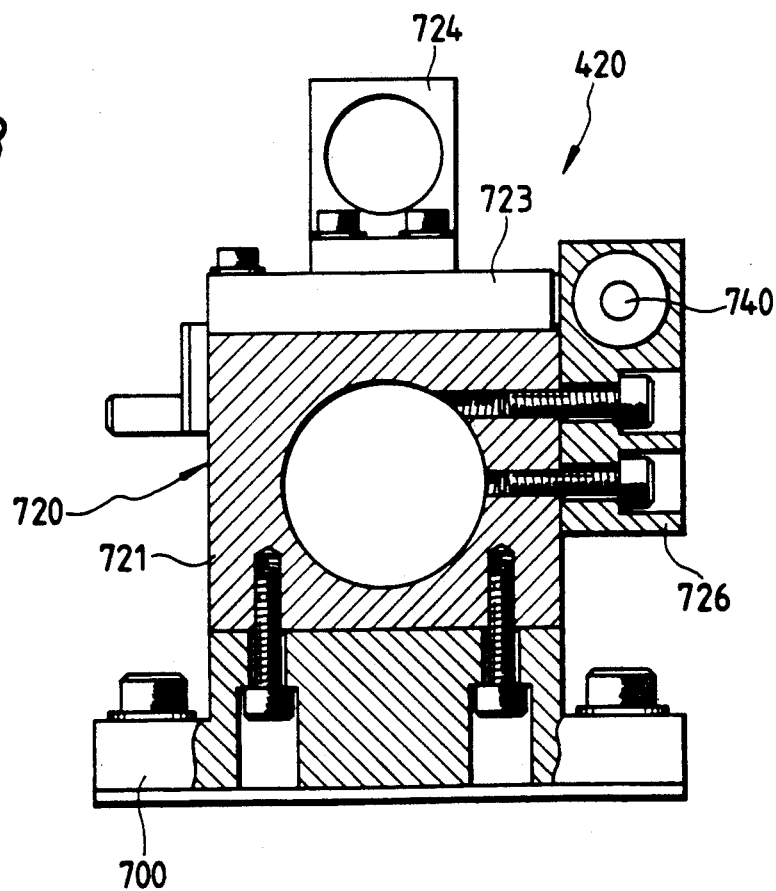
FIG. 23 is a partial fragmentary rear view of the mechanical part.

As shown in FIG. 21, the slidable adjusting unit 710 is composed of a fixed part 711 which is fixed to the base 700 and a movable part 712 which is adapted to be slidable in the direction of the optical axis by means of the guide rail mechanism in the fixed part. The fixed part 711 has a micrometer head 730 for slidable adjustment that is secured thereto via a holder 713. As shown in FIG. 20, the movable part 712 has a hole that serves as an optical path in which is secured a metal member 714 having an L-shaped cross section and which has the first prism 421 bonded thereto. The movable part 712 also has a guide member 715 as an integral member that is secured at such a position that it faces the micrometer head 730.

The movable part 712 is urged by an integral spring toward the left side as viewed in FIG. 20, and the front end of the spindle 731 of the micrometer head 730 is pushed against the guide member 715. Hence, the movable unit 712 can be slidably adjusted in the direction of the optical axis by pivotally adjusting the micrometer head 730. After adjustment to a predetermined position, the bolts are tightened to secure the movable part 712 to the fixed part 711.

The pivotal adjusting unit 720 has a fixed part 721 which is bolted to the base 700 and a rotating stage 723 that is mounted on the fixed part 721 in such a way that it is pivotable about a pivotal axis 722 positioned at the center of the second prism 422. The rotating state 723 has secured thereto a metal member 724 that has an L-shaped cross section and to which the second prism 422 is bonded. Further, the rotating stage 723 has a bar 725 that projects from one end and which rotates together with this stage (see FIG. 20).

As shown in FIG. 20, the fixed part 721 has two laterally projecting retaining members 726 and 727 secured to one of its end faces. The retaining member 726 is furnished with a micrometer head 740 for pivotal adjustment, and the retaining member 727 is furnished with a spring plunger 750 facing the micrometer head.

The bar 725 projecting from the rotating stage 723 is held between the front end of the spindle 741 of the micrometer head 740 and the spring plunger 750 and the angle of inclination of the second prism 422 can be set to a desired value by adjusting the micrometer head 740. After adjusting the inclination of the second prism to the settings shown in FIG. 15 and Table 4, the rotating stage 723 is secured to the fixed part 721 with bolts.

The first and second optical axis tuning units are located in the optical path of the primary diffracted beam emerging from the first pattern drawing AO modulator with their bottom surfaces inclined by a diffracting angle of 1°.

Figure 24:
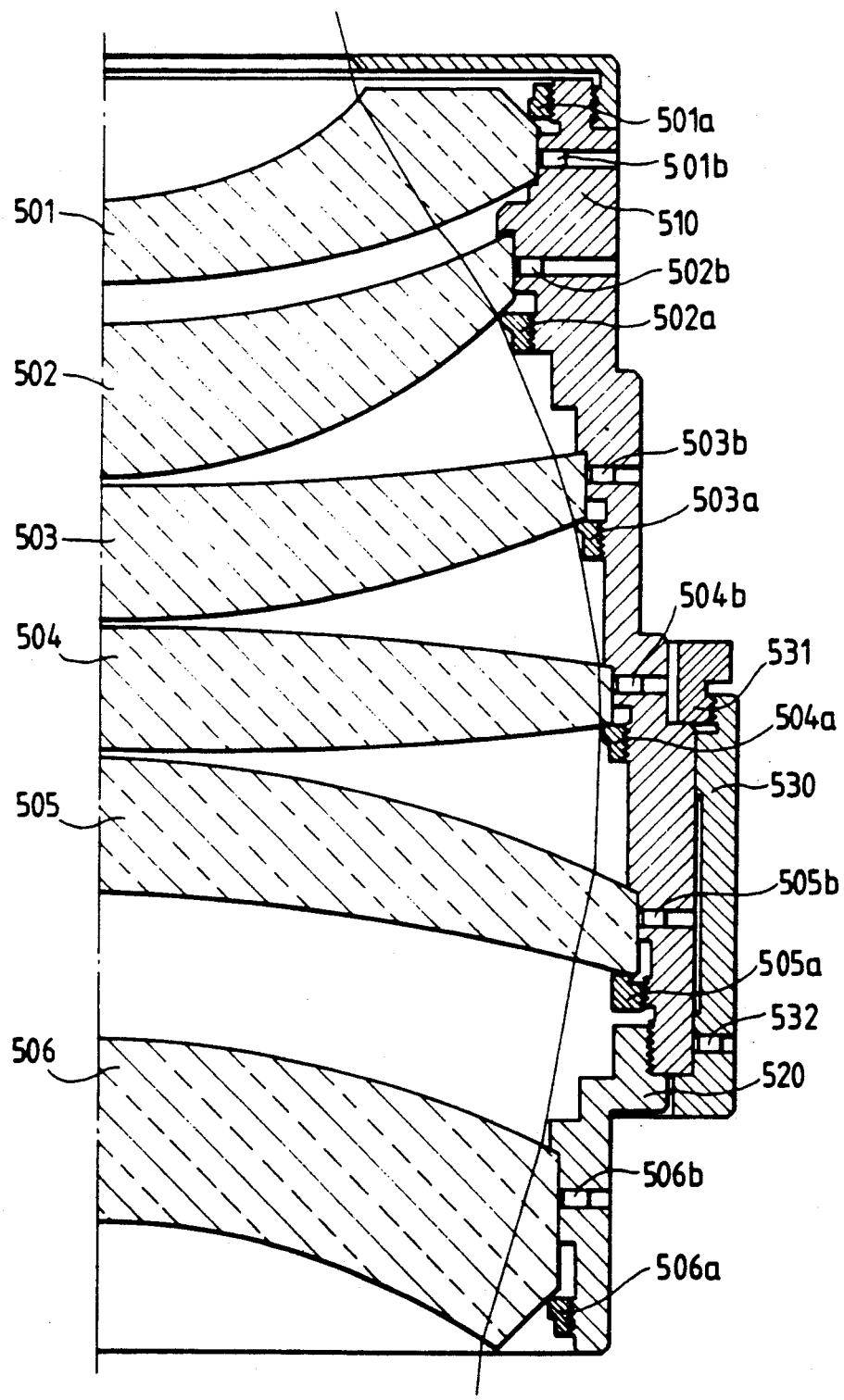
FIG. 24 is a cross-sectional view showing the structure of the fθ lens support used in the photoplotter of FIG. 1.

The securing of the fθ lens 500 to the optical head unit 4, as well as the mechanisms of the monitor detecting unit 800 and focus detecting unit 900 positioned adjacent the fθ lens 500 will now be described. The fθ lens used in the system under consideration is very bright (F/number=6) and has such a high precision that tolerances for the eccentricity of lens surfaces are very close, with the permissible tilting of a surface being on the order of seconds. However, with an fθ lens for use in one-dimensional scanning, it is only that part extending along the scan line which will function as an effective lens. Thus, the fθ lens 500 used in the apparatus according to the embodiment under consideration is provided with a rotating mechanism so that after installation the lens can be rotationally adjusted and fixed at a position where the best lens performance is ensured. This adjusting mechanism is as shown in FIG. 24.

First to fifth lens element 501-505 have their respective edges held between the steps on the main barrel 510 and ring screws 510a-505a and are secured by means of buried bolts 501b-505b in contact with their respective peripheral edge faces. The first lens element 501 is inserted from above as viewed in FIG. 24 and the other lens elements are inserted from below.

A sixth lens element 506 has its edge held between the step on a sub-barrel 520 and a ring screw 506a and is secured by means of a buried bolt 506b in contact with its peripheral edge face. The sub-barrel 520 is mounted by being threaded into the main barrel 510 which is supported by an inward flange formed at the lower end of a cylindrical holder 530 surrounding said main barrel. The upper end of the holder 530 is in threadable engagement with a ring screw 531. This holder 530 is supportably fixed to the optical head unit 4.

Figure 25:
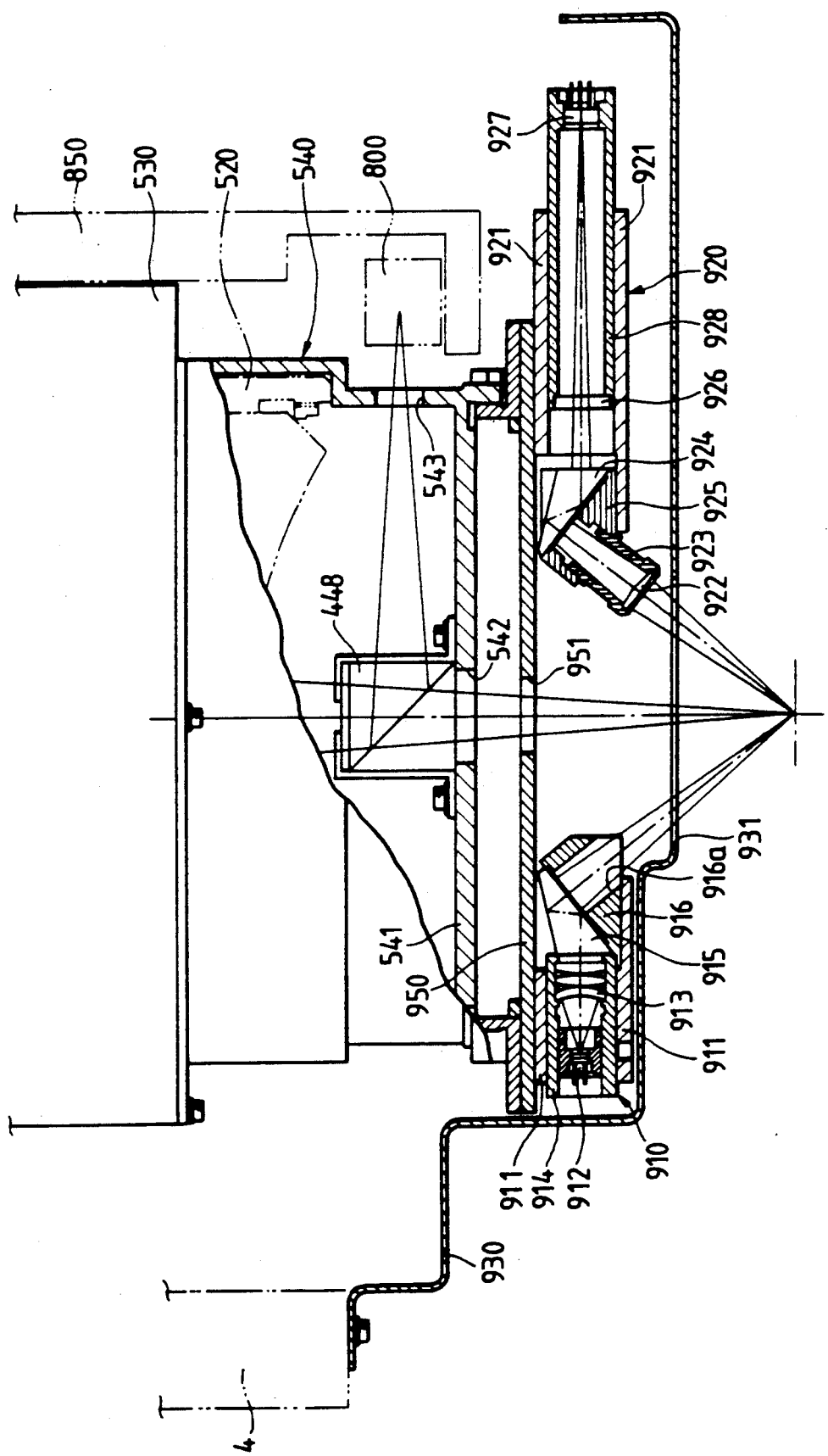
FIG. 25 is a partial fragmentary side view showing the automatic focus (AF) detecting unit used in the above embodiment of the present invention.

For adjusting the fθ lens 500, the main barrel 510 is manually pivoted to rotate the entire lens unit about the optical axis. When the position that insures the best lens performance is determined the buried bolt 532 is tightened so as to secure the main barrel 510 to the holder 530. As shown in FIG. 25, the underside of the holder 530 is equipped with a bottomed cylindrical lens cover 540 with a step which covers the lower end of the sub-barrel 520.

The second polarizing beam splitter 448 is positioned in such a way that it covers a long slit 542 made in the bottom wall 541 of the lens cover 540 in the scanning direction. The side wall of the lens cover 540 is provided with a through-hole 543 through which the monitor beam reflected from the second polarizing beam splitter 448 is guided to the outside of the lens cover. The size of the hole 543 should not be smaller than the scan width of the beam. The monitor detecting unit 800 is supported by an arm 850 fixed to the holder 530 and is positioned so as to face the through-hole 543. Below the lens cover 540 are fixed a light-emitting and a light-detecting section 910 and 920 of the focus detecting unit 900 via a support disk 950 which has a slit 951 for transmitting a light beam.

The light-emitting section 910 is composed of a hollow retaining member 911 screwed to the support disk 950, a tubular bush 914 that is fitted into the retaining member 911 and which holds a light-emitting diode (LED) 912 and a projecting lens 913, a prism 915 by which the light beam emerging from the projecting lens 913 in a direction parallel to the drawing surface is reflected toward the latter, and a prism base 916 disposed at one end of the retainer 911 to fix the prism 915 in position. The prism base 916 has a hole 916a formed therein for transmitting the reflected light from the prism 915. As shown in FIG. 25, the light-emitting section is so designed that it emits light which will converge on the drawing surface at the position where the pattern drawing beams are to converge. The LED 912 emits light at a wavelength of 860 nm, which is outside the range of sensitivity of photographic films, light-sensitive materials, etc., onto which the patterns are to be recorded.

The light-detecting section 920 is composed of a hollow retaining member 921 screwed to the support disk 950, a lens barrel 923 for holding a condenser lens 922 provided on the side of the retaining member 921 that is the closer to the light-emitting section 910, a prism 924 by which the direction of the convergent light obtained with the condenser lens 922 is changed to become parallel to the drawing surface, a prism 925 for holding this prism, and a tubular bush 928 that is fitted into the retaining member 921 and which holds an infrared light transmitting filter 926 and a position sensing device (PSD) 927.

The PSD 927 is a one-dimensional sensor that detects the difference in the position of condensation of the beam from the light-emitting section 910 which takes place as the distance to the drawing surface increases or decreases and the detected difference is produced as an output signal from the PSD. This PSD may be replaced by other devices such as a CCD (charge-coupled device). In the example given, a long distance is provided behind the condenser lens 922 in order to amplify the difference in the position of light condensation on the PSD 927. The infrared light transmitting filter 926 is used to improve the S/N ratio of the output from the sensor.

A cover 930 is provided beneath the light-emitting and light-detecting sections 910 and 920 secured to the optical head unit 4. The cover 930 has an aperture 931 which permits the passage of both the pattern drawing beams and the focus detecting beam.

Figure 26:
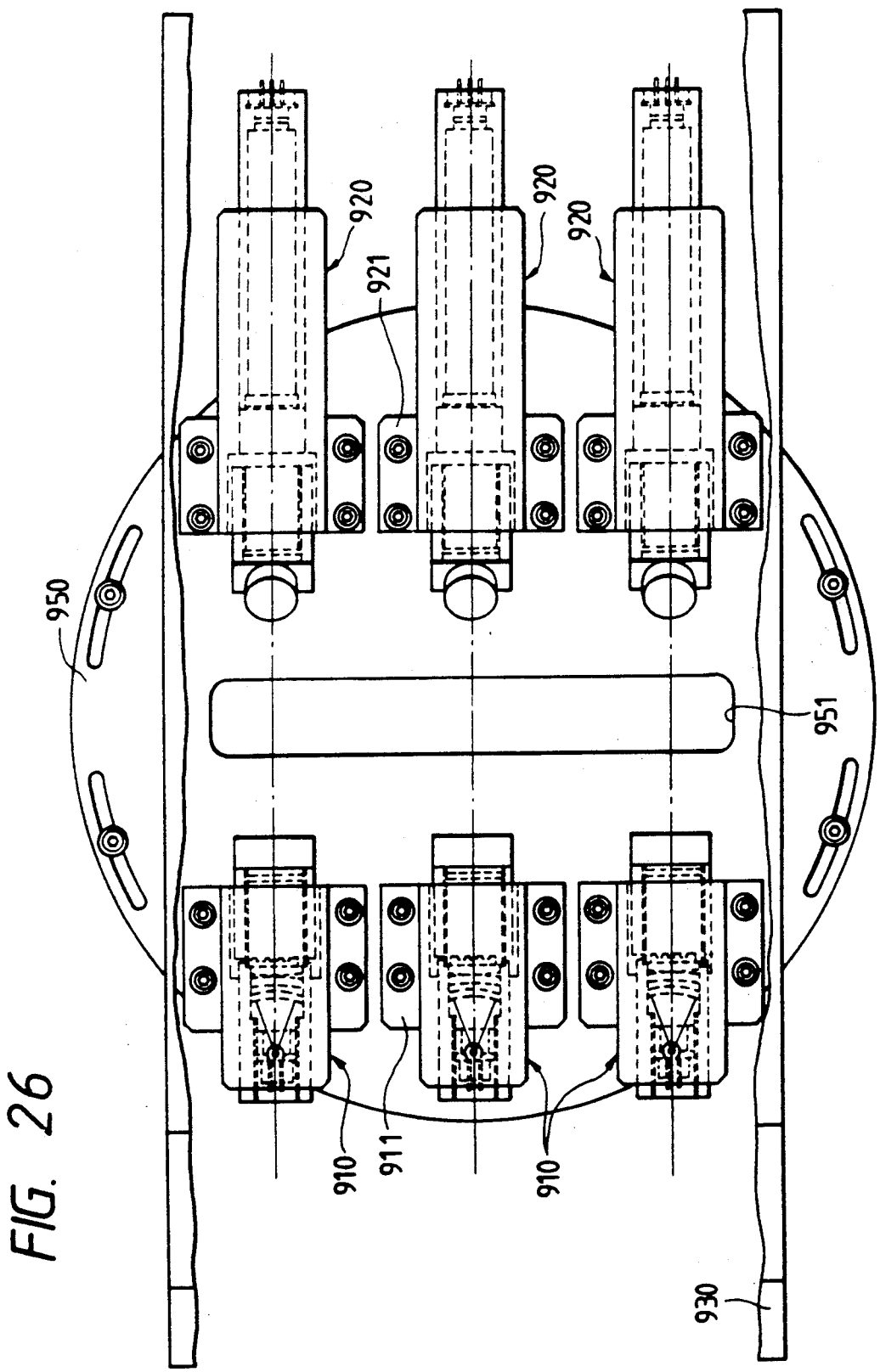
FIG. 26 is a plan view of FIG. 25 as seen looking into the drawing surface.

As shown in FIG. 26 (a plan view of FIG. 25 as seen looking into the drawing surface), each of the light-emitting and light-detecting sections 910 and 920 is composed of three sets which are spaced in the direction of scanning with the pattern drawing beams parallel to the length of the slit 951. This enables the gap between the drawing surface and the focus detecting mechanism to be detected in a vertical direction (as viewed in FIG. 26) at three points on the scanning line (in the example given, the two points substantially on opposite ends of the range of scanning with pattern drawing light and the single point on its center), thereby allowing accurate determination of the gap and the inclination of the drawing surface. On the basis of the results of this determination, the drawing board 300 is moved vertically or tilted to control the position of the waist of the pattern drawing beam so that it coincides with the drawing surface.

Figure 27:
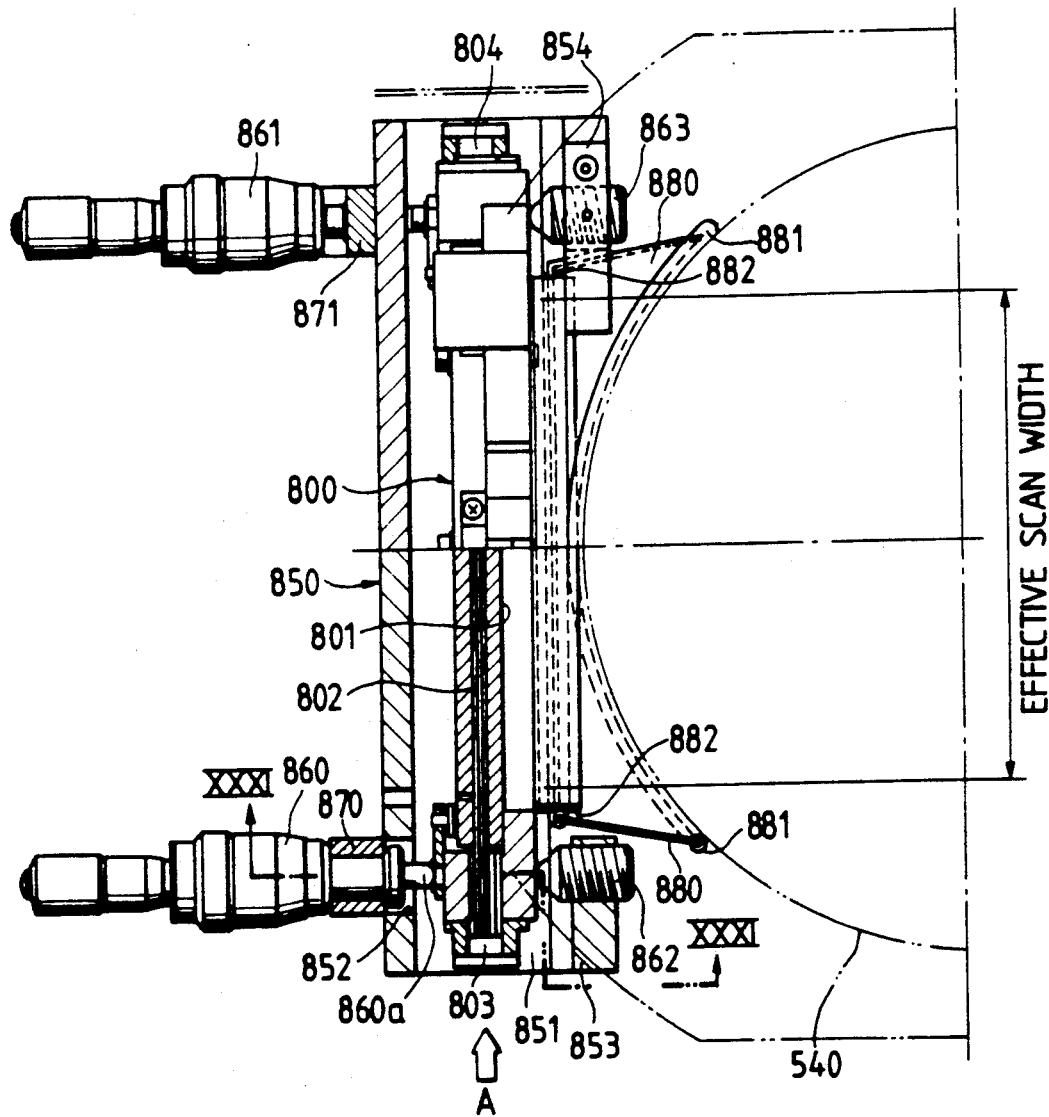
FIG. 27 is a partial fragmentary plan view showing the monitor detecting unit used in the above embodiment of the present invention.

The monitor detecting unit 800 shown by a one-long-and-two-short dashed line in FIG. 25 is shown more specifically in FIG. 27. As is apparent from FIG. 27, this unit is a unitary assembly of a glass scale 801 having slits formed in a stripe pattern at a pitch of 160 $\mu$m on the end face where incident light falls, a fiber bundle 802 composed of plural fluorescent optical fibers, and two PIN photodiodes 803 and 804 provided on opposite ends of the fiber bundle 802.

Monitor light is launched laterally into the fluorescent optical fiber bundle 802 via the scale 801 and propagates through the fiber until it reaches the PIN photodiodes 803 and 804 at opposite ends. When the monitor light scans over the scale 801, the PIN photodiodes produce a sine wave output. The sine wave is shaped to a rectangular wave, which is fed into the control system and used to time the control of the first and second pattern drawing AO modulators 407 and 407' and to control the compensating AO modulator 432 for compensating for the change in the direction of reflected light that occurs on account of the rotation of the polygonal mirror 450 in one plane. It should however be noted that the slit pitch of 160 $\mu$m produces a pulse which is too wide compared to the spot diameter of 5 $\mu$m. To deal with this problem, each pulse is electrically divided to 1/64 of the initial width so that one pulse will be produced in response to scanning over a width of 2.5 $\mu$m.

Monitor light freely passes through ordinary optical fibers. However, fluorescent optical fibers produce fluorescence upon illumination with light, and the resulting fluorescent light propagates through the fibers to reach the PIN photodiodes on opposite ends. Theoretically, a PIN photodiode need only be provided at one end of the fiber bundle, but in order to attain a constant quantity of light irrespective of the position illuminated with the monitor light, a diode is desirably positioned at both ends as in the embodiment under consideration.

Figure 28:
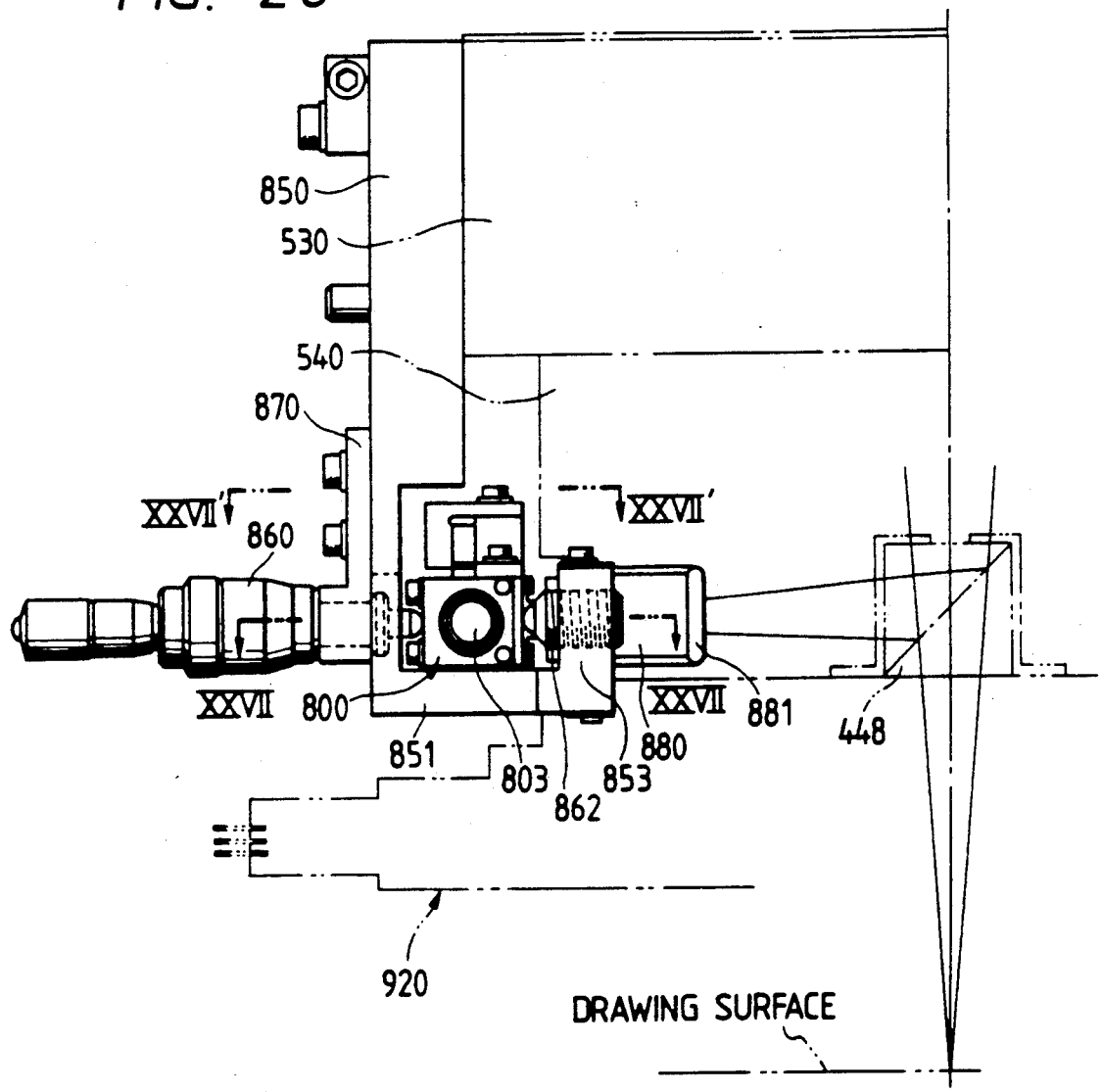
FIG. 28 is a side view of FIG. 27 as seen looking in the direction indicated by an arrow A.

As shown in FIG. 28 (a side view of FIG. 27 as seen looking in the direction indicated by arrow A), the monitor detecting unit 800 is carried on an L-shaped member 851 formed at the lower end of an arm 850 and is positioned by being held between a micrometer head 860 and a spring plunger 862 fixed at one end of the arm 850 and between a micrometer head 861 and a spring plunger 863 fixed at the other end of the arm.

The lower half of FIG. 27 is a cross section of FIG. 28 as seen looking in the direction indicated by arrows XXVII, and the upper half of FIG. 27 is a cross section of FIG. 28 as seen looking in the direction indicated by arrows XXXVII'.

The micrometer heads 860 and 861 are secured by fasteners 870 and 871, respectively, which are screwed to the side wall of the arm 850. The spindle 860a of the micrometer head 860 is urged against the monitor detecting unit 800 through a hole 852 formed in the side wall of the arm 850. The spring plungers 862 and 863 are secured by support walls 853 and 854, respectively, which extend upward from the carrying member 851 and press the monitor detecting unit 800 toward the micrometer heads. By adjusting the micrometer head 860 and 861, not only the horizontal position of the monitor detecting unit 800 with respect to the incident direction of light beam but also its inclination in the scanning direction can be adjusted, thereby enabling the fine tuning necessary to insure that the end face of the scale 801 where incident light is admitted will be set at a position equivalent to the drawing surface.

Figure 29:
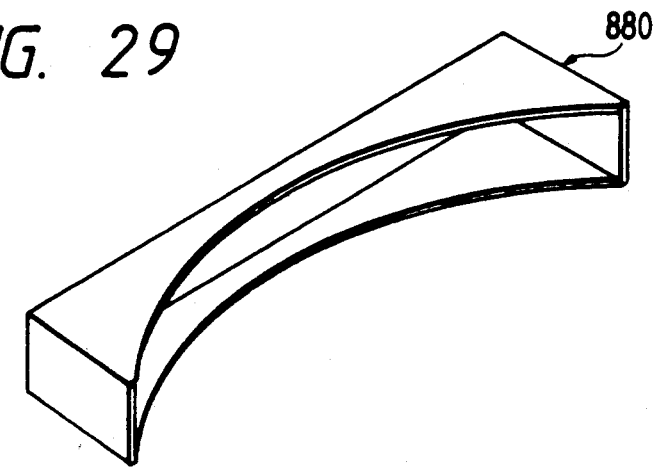
FIG. 29 is a perspective view of a frame member.

Monitor light emerges through the hole 543 in the lower part of the side wall of the lens cover 540, and the monitor detecting unit 800 is positioned to face this through-hole 543 so that it will properly admit the emerging monitor light. A frame member 880 is disposed between the lens cover 540 and the monitor detecting unit 800. As shown in FIG. 29, this frame member is open on both sides in such a way that one side forms an arc following the contour of the lens cover 540, with the other side being linear. Silicone tubes 881 and 882 having cutouts in their side walls are fitted to the respective open sides of the frame member 880 so that their edges are in intimate contact with the lens cover 540 and the arm 850.

Figure 30:
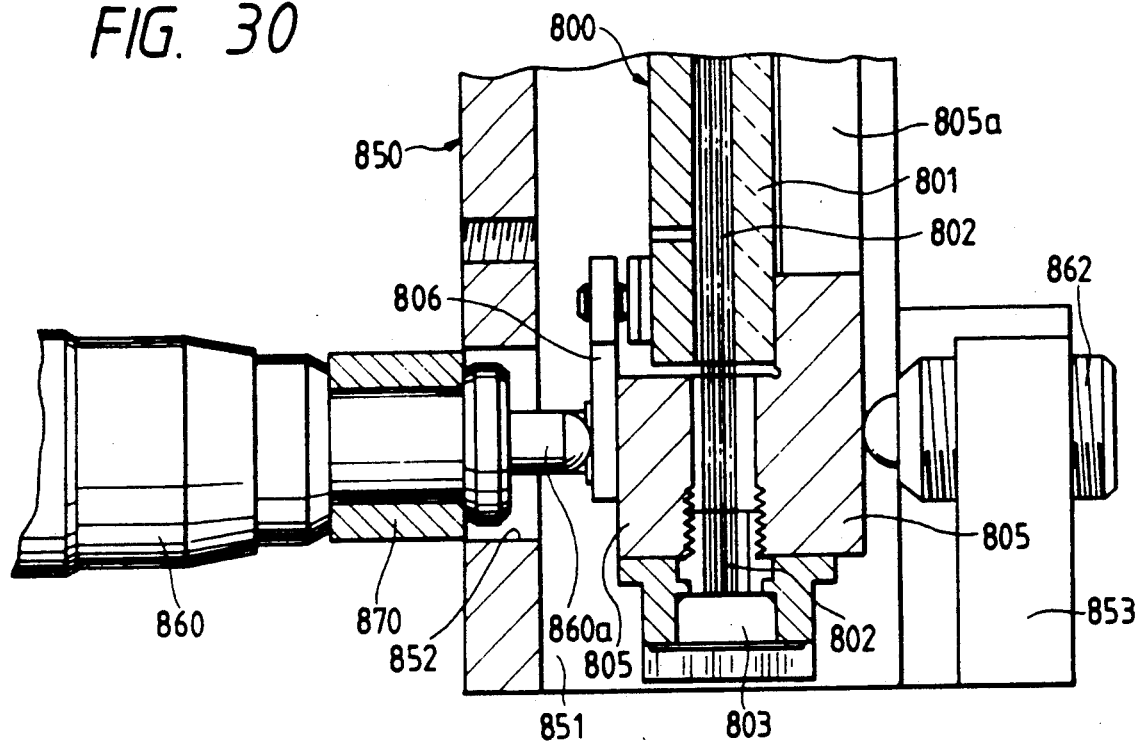
FIG. 30 is a partial enlarged view of FIG. 27.
Figure 31:
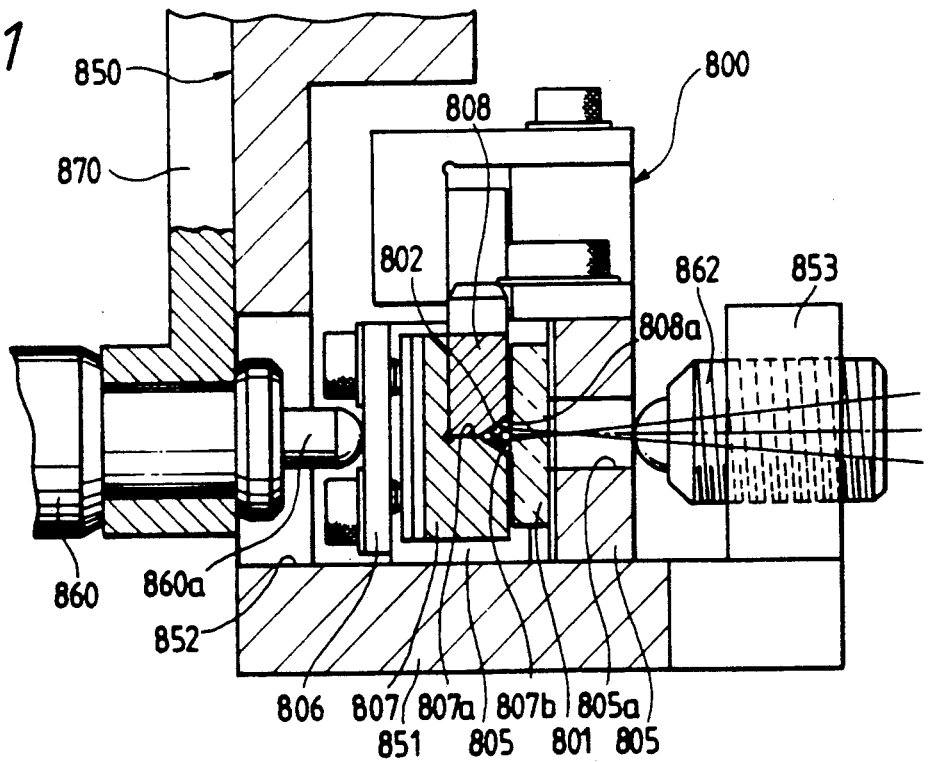
FIG. 31 is a cross section of FIG. 27 as seen looking in the direction indicated by arrows XXXI.

As shown more specifically in FIGS. 30 and 31, the monitor detecting unit 800 includes a base 805 that has a rectangular hole 805a formed in the front face for permitting the passage of monitor light and which makes direct contact with the micrometer head and the spring plungers, and a compressive plate 807 which presses the scale 801 against the base 805 by the urging force of a leaf spring 806 fixed to the effective portion of the spindle 860a. FIG. 30 is a partial enlarged view of FIG. 27, and FIG. 31 is a cross section of FIG. 27 as seen looking in the direction indicated by arrows XXXI.

As shown in FIG. 31, the compressive plate 807 has a ledge-like cutout 807a on the side facing the scale 801, and the corners of this cutout which are the closer to the scale 801 have an inclined surface sloping downward to the scale 801 so as to insure the provision of a space for accommodating the fiber bundle 802. A fastening piece 808 is inserted into the cutout 807a to hold down the fiber bundle 802 from above as seen in FIG. 31. The fastening piece 808 has an inclined surface 808a formed at its end which is symmetrical in space to the inclined surface 807b of the compressive plate 805. The fiber bundle 802 is fixed within the space formed between the two inclined surfaces and the scale and which has a triangular cross section.

When the beam position on the reflecting surfaces of the polygonal mirror changes in response to its rotation, the position of incidence on the f$\theta$ lens will also change, impairing telecentricity in the marginal area. Therefore, unless the positions of the drawing surface and the scale are optically completely equivalent to each other, it is impossible to obtain a monitor signal that has exact correspondence to the actual position of pattern drawing. This deviation is usually too small to become a problem, but in the apparatus being considered where each of the fields to be scanned for pattern drawing is exposed with it being divided into a plurality of lanes, a deviation in the marginal area will cause discontinuity in the pattern on the border between adjacent lanes. In order to deal with this problem, the system of the present invention is so designed that when the position of the polygonal mirror is adjusted, due consideration is given to the possible change in the point of deflection to insure telecentricity at the marginal area of the effective scan width, although telecentricity in the central area may be slightly affected.

Figure 32:
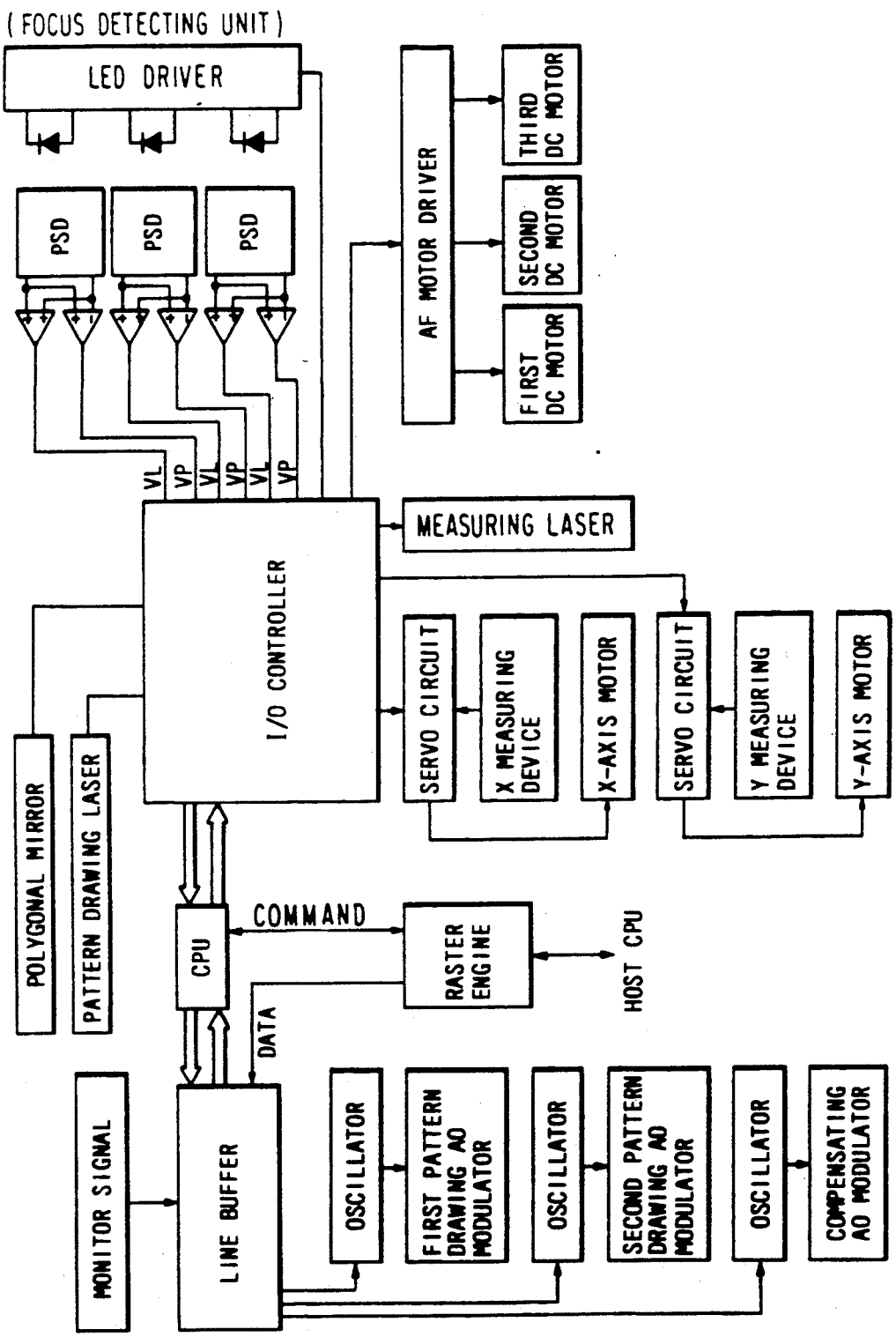
FIG. 32 is a block diagram of the control system used in the above embodiment of the present invention.

The manner in which the photoplotter having the construction described above is controlled will now be explained. As shown in FIG. 32, the control system includes a raster engine connected to a host CPU for converting pattern drawing data to raster scanning data, a line buffer which writes and reads data via the raster engine, one unit of data corresponding to one scanning line, and a CPU which inputs or outputs various commands to control the line buffer or an I/O (input/output) controller. The line buffer drives the first and second pattern drawing AO modulators and the compensating AO modulator via associated oscillators in synchronism with the monitor signal supplied from the monitor detecting unit 800. The I/O controller drives the pattern drawing laser and the polygonal mirror in response to commands from the CPU. The I/O controller also drives the three LEDs in the focus detecting unit 900, and the outputs of the PSDs accepting the light from these LEDs are fed into this controller via six operational amplifiers, two being provided for each PSD. One member of each operational amplifier pair produces an output VL as a signal indicating the magnitude of the light beams converged on the PSD and the other member produces an output VP as a position signal which corresponds to the position where the light beams were converged. By dividing the position signal by the quantity signal, the effects due to the overall variation of light quantity are cancelled to enable the detection of the positional relationship between the detecting mechanism and the drawing surface for individual points.

The I/O controller supplies the CPU with the above-described input signals from the focus detecting unit, and in response to these signals the CPU determines the amounts by which the respective AF motors are to be driven and sends them back to the I/O controller. Based on these driving amounts, the I/O controller controls the respective AF motors via an AF motor driver and adjusts the vertical position of the drawing board 300 and the angle of its inclination in such a way that the drawing surface is with in ±15 μm of the depth of focus of the fθ lens 500.

The I/O controller also controls the measuring laser 460 in order to perform heterodyne measurements. Further, it controls servo circuits which drive the X-axis motor 101 and Y-axis motor 201 under the control of feedback signals from X and Y measuring devices which make use of the light beam from the laser 460.

The operating theory of the focus detecting unit and the method of driving the drawing board will now be described. With a large scanning optical system of the type contemplated by the present invention, it is difficult to attain focus at individual positions of a single scan stroke by vertically moving the drawing surface. However, asperities on the drawing surface are less wavy than the scan width, so the intended object can satisfactorily be attained by using a drive means of relatively slow response to effect vertical movements of the drawing surface in such a way that it maintains a constant position within a single stroke of scanning.

Further, when the position of the drawing surface is detected at several points spaced apart in the scanning direction as in the example being considered, the inclination of the drawing surface can also be detected and the waviness and other flaws Of the drawing surface can be dealt with in a more adaptive way by tilting it on the basis of the detected angle of its inclination.

Figure 33:
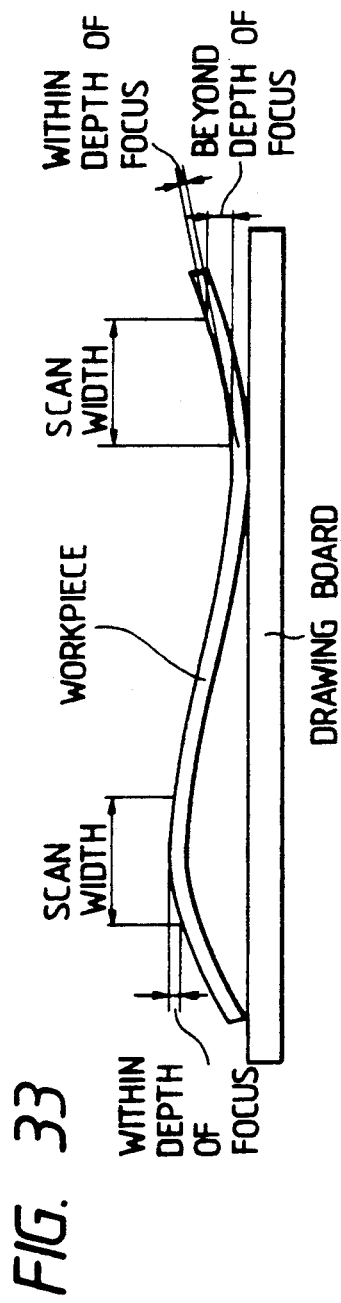
FIG. 33 is a diagram illustrating the inclination or waviness of the drawing surface.

This will be apparent from a consideration of FIG. 33. As shown on the left side of this diagram, satisfactory pattern drawing can of course be accomplished if the difference in the height of the workpiece within the width of a single stroke of scanning is within the depth of focus. Even if the difference in the height on the horizontal drawing board is beyond the depth of focus, as shown in the right side of the diagram, it can be adjusted to be within the depth of focus, as far as the scan width of interest is concerned, by tilting the drawing board until the area indicated by the dashed line becomes horizontal.

Figure 34:
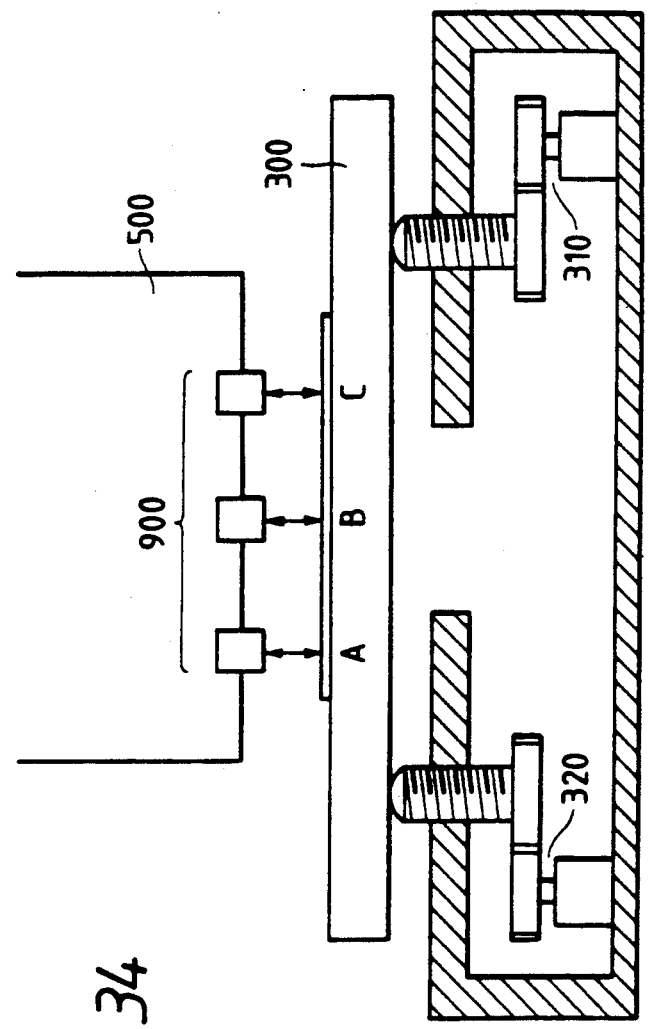
FIG. 34 is a schematic presentation of an AF drive mechanism.

FIG. 34 is a simplified drawing of the mechanism for driving the drawing board 300 in the embodiment under consideration. In practice, the drawing board is supported at three points by means of three drive units, but as described above, the two drive units on one side of the scanning direction are driven by the same signal. For convenience, only two drive units 310 and 320 are shown in FIG. 34 to typify the drive mechanism of the drawing board.

Figure 35:
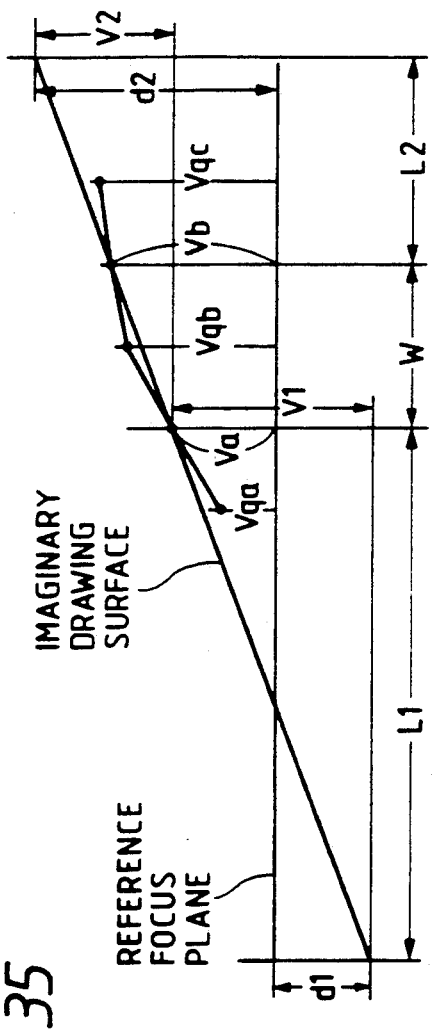
FIG. 35 is a diagram illustrating the principles of AF detection and drive.
Figure 37:
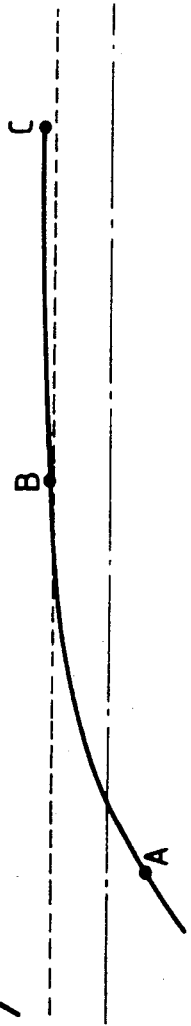
FIGS. 37 and 38 are diagrams illustrating two methods of detecting the position of the drawing surface.
Figure 38:
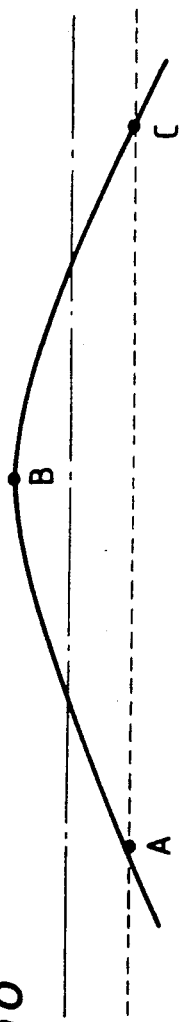

If, as a result of detection at three points A, B and C (see FIG. 34), $V_{qa}$, $V_{qb}$ and $V_{qc}$ (see FIG. 35) are produced as output voltages that indicate deviations at the respective points from the reference focus line, then $V_A$, or the voltage corresponding to the middle point $M_1$ between A and B, and $V_b$, or the voltage corresponding to the middle point $M_2$ between B and C, can be expressed by:

$$V_a = (V_{qa} + V_{qb})/2$$

$$V_b = (V_{qb} + V_{qc})/2$$

The straight line passing through the middle points $M_1$ and $M_2$ indicates an imaginary drawing surface where the distances from points A, B and C are minimum on average. By controlling the respective AF drive units in such a way that this imaginary drawing surface will coincide with the reference focus line, the individual points in a scan field can usually be adjusted to fall within the focus range. Voltages $d_1$ and $d_2$, corresponding to the amounts by which the motors have to be driven to perform this control, can be calculated as follows, assuming that the horizontal distance between middle points $M_1$ and $M_2$ is denoted by W and the horizontal distance between each fulcrum and middle point M1 by L1, and the horizontal distance between each fulcrum and middle point $M_2$ by $L_2$:

$$d_1 = V_a - V_1 = V_a - (L_1/W)(V_b - V_a)$$

$$d_2 = V_a + V_2 = V_a + \{(W+L_2)/W\}(V_b - V_a)$$

The foregoing description assumes that the maximum amount of displacement of the drawing board is 10 mm taking into account two cases, one for placing a glass plate as the workpiece on the drawing board and the other for placing a photographic film as the workpiece.

The basic operation involved in driving the drawing board 300 will now be described. When the power is on, the CPU supplies a signal to the I/O controller so that the drawing board is lowered to its lowermost position When the limit switch on the Y table senses that the descending board has reached the lowermost position, a different motor takes over to start elevating the board.

Thus, no signal for controlling the focus detecting unit 900 will be generated in the initial period. It is not until a signal starts to be generated after the drawing board 300 is slowly elevated while detecting the signal from the focus detecting unit 900 that focus detection and control to drive the drawing board will be performed on the basis of the principles described above.

The position where focus is attained on the drawing board by the fθ lens is preliminarily stored as three PSD signals produced from the focus detecting unit 900 by performing a test pattern drawing to search for the position where optimum drawing would actually be possible, or the position where a minimum spot diameter would be obtained. Hence, the three PSD outputs are not necessarily the same in the case where the drawing surface is in focus. The control system drives the three motors in such a way that the difference between the output signal for the focus position and the present signal will be zero.

The control method is not such that the motors are driven a single time by the amounts determined by the procedure described above, but is such that after the motors are driven by certain amounts, a signal is again received from the focus detecting mechanism and subsequent driving is performed with the amounts of drive being determined on the basis of the new input.

Figure 36:
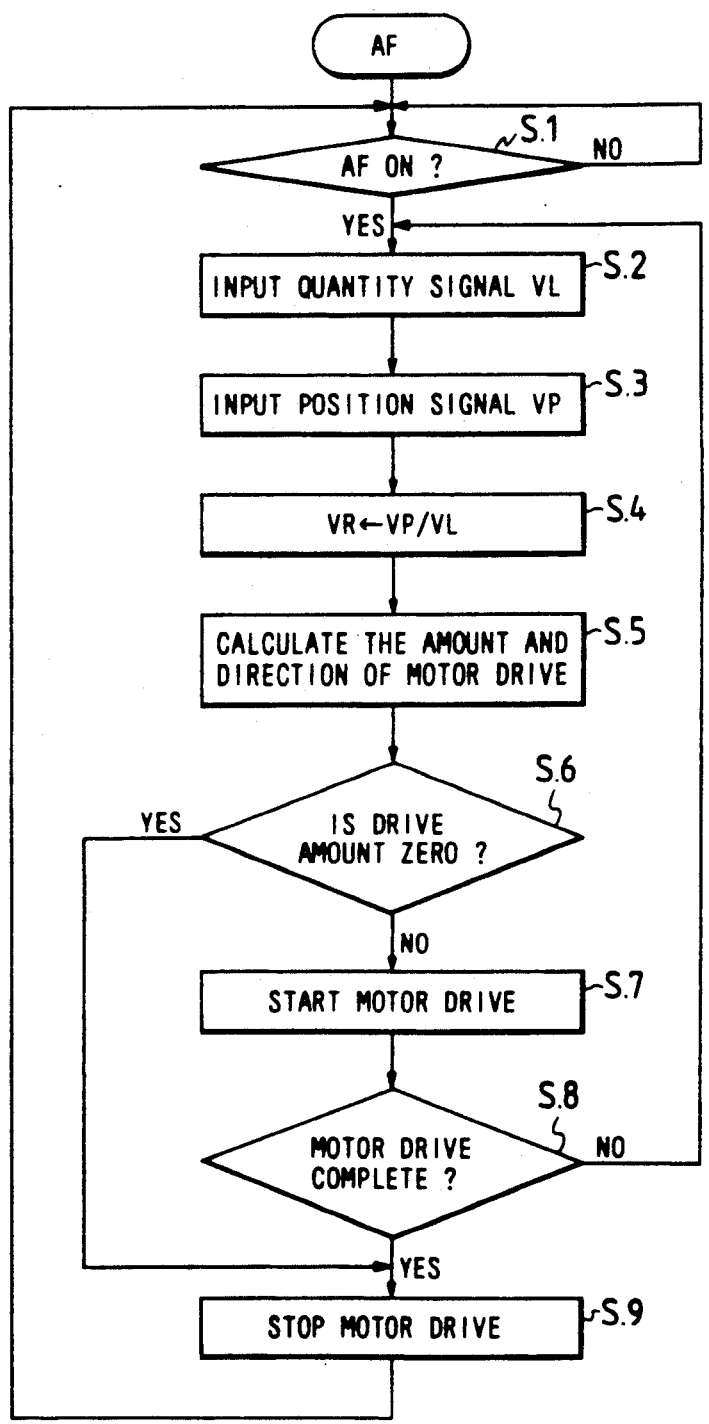
FIG. 36 is a flowchart for the AF procedure.

The sequence of steps in this control method is as shown by the flowchart of FIG. 36. When an AF signal starts to be supplied and if AF is permitted, the sequence goes through Step 1 and quantity signal VL is input in Step 2 and position signal VP input in Step 3. In Step 4, the position signal is divided by the quantity signal to obtain a pure position signal VR which has been freed of any effect due to the change in the quantity of light. In Step 5, this pure position signal VR is compared with the signal for a predetermined focus position on the drawing board to calculate the amount and direction of the driving of each motor. If the amount of motor drive thus calculated is found to be non-zero in Step 6, the sequence goes to Step 7 to start motor drive, and a determination is made in Step 8 of whether the motor has completed driving by the calculated amount. If the driving is not complete, the sequence returns to Step 2 and quantity signal VL is input. If the amount of drive is found to be zero in Step 6 or if motor drive is found to have been completed in Step 8, the sequence goes to Step 9 and the motor is stopped. Thereafter, the sequence returns to Step 1 and the same procedure as described above is repeated.

The photoplotter under consideration is assumed to handle various workpieces ranging from thick objects such as glass plates to thin objects such as photographic films. Thus, the height of the drawing board will inevitably vary depending upon the thickness of a specific workpiece. However, according to the method described above, the drawing board carrying the workpiece is allowed to ascend from the lowermost position, and thus the focus detecting unit will first sense information about the position of the optical head with respect to the top surface of the workpiece. Thus, even if a workpiece having a different thickness is set on the drawing board, the fθ lens is capable of attaining focus on its surface.

As described above, the drawing surface adjusting mechanism of the present invention for use with a scanning pattern drawing apparatus is capable of correcting the distance from the scanning optical unit to the drawing surface by detecting it on a plurality of points that are substantially parallel to the line of scanning by light beams. Therefore, even if the drawing surface contains waviness or some other flaws within a single scanning field, the results of detection on those points can be averaged to provide a basis for driving the drawing surface, thereby increasing the chance of adjusting it to fall within the depth of focus of the scanning lens.

If the drive mechanism is composed of two sections, one for tilting the drawing surface and the other for effecting its parallel displacement, that area of the drawing surface which would not otherwise fall within the depth of focus of the scanning lens can be adjusted to be located within the depth of focus by tilting the drawing board or table in accordance with the degree of waviness on the drawing surface.

What is claimed is:

1. A drawing surface adjusting mechanism for use with a scanning pattern drawing apparatus in which a scanning optical system scans drawing rays of light along scanning lines on a workpiece on a drawing board, comprising:

a plurality of light-emitting units for projecting rays of light in a wavelength region outside a sensitivity range of said workpiece onto a drawing surface of said workpiece in such a way that said rays substantially converge at more than one point on a scanning line of said drawing rays of light from said scanning optical system;

a plurality of condenser lenses for focusing beams of light from said plural light-emitting units after said beams have been reflected by said drawing surface;

a plurality of light-detecting elements disposed at points of condensation by respective ones of said condenser lenses and which produce output signals representing differences in condensation points that occur as said lenses depart from or approach said drawing surface; and drive means for effecting a relative displacement between said scanning optical system and said drawing board in response to said outputs from said plural light-detecting elements.

2. The drawing surface adjusting mechanism according to claim 1, wherein said drive means comprises two sections, one for tilting said drawing board with respect to said scanning optical system and the other for effecting parallel displacements of said drawing board in such a way that it departs from or approaches said scanning optical system.

3. The drawing surface adjusting mechanism according to claim 1, wherein each of said light-emitting units comprises: a light-emitting diode, a projecting lens receiving light output from said light-emitting diode, and a prism receiving light output from said projecting lens and directing said light toward said drawing board.

4. The drawing surface adjusting mechanism according to claim 3, wherein said prism directs said light output in a direction substantially parallel to said drawing surface.

5. The drawing surface adjusting mechanism according to claim 3, wherein said light-emitting units project said rays in directions so as to converge on said drawing surface at a position where said drawing rays converge.

6. The drawing surface adjusting mechanism according to claim 5, wherein said light-emitting diode emits light at a wavelength of substantially 860 nm.

7. The drawing surface adjusting mechanism according to claim 1, wherein each of said light-detecting elements comprises a position sensing device.

8. The drawing surface adjusting mechanism according to claim 7, wherein each of said light-detecting elements comprises a prism and an infrared-transmitting filter disposed between a respective one of said condenser lenses and said position sensing device.

9. The drawing surface adjusting mechanism according to claim 1, wherein said light-emitting units and said light-detecting elements are each three in number spaced in a direction of scanning of said drawing rays.

10. The drawing surface adjusting mechanism according to claim 9, wherein said light-emitting units project rays substantially at opposite ends and a center point of said scanning line, whereby said outputs from said light-detecting elements are indicative of a gap between said light-emitting units and said drawing surface and an amount of inclination of said drawing surface.

11. A drawing surface adjusting mechanism according to claim 1, wherein said drive means moves said workpiece relative to said optical system such that said workpiece maintains a substantially constant position relative to said optical system during a single stroke of scanning along a scanning line.

12. A drawing surface adjusting mechanism according to claim 1, wherein said drive means detects an angle of inclination of said drawing surface relative to said optical system based on said outputs.

13. A drawing surface adjusting mechanism according to claim 1, wherein said drive means tilts said drawing board relative to said optical system in response to said outputs such that the width of a single stroke of scanning along a scanning line is within a depth of focus of said optical system.

14. A drawing surface adjusting mechanism according to claim 1, wherein:
said output signals from said plurality of light-detecting elements comprise at least three output signals each representing an amount by which a respective one of at least first, second and third points on said drawing surface is displaced from a reference focus plane; and
said drive means moves said workpiece relative to said optical system such that a line passing between said first and second points and between said second and third points is parallel to said reference focus plane.

15. A drawing surface adjusting mechanism according to claim 14, wherein said line passes through a fourth point on said drawing surface midway between said first and second points, and passes through a fifth point of said drawing surface midway between said second and third points.

16. A drawing surface adjusting mechanism according to claim 14, wherein said line passes through a fourth point on said drawing surface between said first and second points, and passes through a fifth point on said drawing surface between said second and third points, wherein said fourth point is displaced from said reference focus plane by an amount which is the average of the displacement of said first and second points from said reference focus plane, and wherein said fifth point is displaced from said reference focus plane by an amount which is the average of the displacement of said second and third points from said reference focus plane.

17. A drawing surface adjusting mechanism according to claim 14, wherein said drive means moves said workpiece relative to said optical system such that said line passing between said first and second points and between said second and third points is disposed substantially on said reference focus plane.

18. A drawing surface adjusting mechanism for use with a scanning pattern drawing apparatus in which a scanning optical system scans drawing rays of light along scanning lines on a drawing surface of a workpiece, said mechanism comprising:
a detection system detecting an inclination of said drawing surface with respect to said optical system; and
an adjustable support for tilting the drawing surface relative to said optical system in response to the detected inclination.

19. A drawing surface adjusting mechanism for use with a scanning pattern drawing apparatus in which a scanning optical system scans drawing rays of light along scanning lines on a drawing surface of a workpiece, said mechanism comprising:
a focus detection system detecting an amount by which at least two points on said drawing surface are displaced from a reference plane; and
an adjustable support which is responsive to the detected amounts of displacement to tilt the drawing surface relative to said optical system such that the width of a single stroke of scanning along a scanning line is within a depth of focus of said optical system.

20. A drawing surface adjusting mechanism for use with a scanning pattern drawing apparatus in which a scanning optical system scans drawing rays of light along scanning lines on a drawing surface of a workpiece, said mechanism comprising:
a detection system detecting an inclination of said drawing surface with respect to said optical system; and
an adjustable support for tilting the drawing surface relative to said optical system in response to the detected inclination.

21. A drawing surface adjusting mechanism for use with a scanning pattern drawing apparatus in which a scanning optical system scans drawing rays of light along scanning lines on a drawing surface of a workpiece, said mechanism comprising:
a detection system detecting the respective amounts by which each of at least first, second and third points on said drawing surface are displaced from a reference focus plane; and
an adjustable support which is responsive to the detected displacement amounts to move said workpiece relative to said optical system such that a line passing between said first and second points and between said second and third points is parallel to said reference focus plane.

22. A drawing surface adjusting mechanism according to claim 21, wherein said line passes through a fourth point on said drawing surface midway between said first and second points, and passes through a fifth point on said drawing surface midway between said second and third points.

23. A drawing surface adjusting mechanism according to claim 21, wherein said line passes through a fourth point on said drawing surface between said first and second points, and passes through a fifth point on said drawing surface between said second and third points, wherein said fourth point is displaced from said reference focus plane by an amount which is the average of the displacement of said first and second points from said reference focus plane, and wherein said fifth point is displaced from said reference focus plane by an amount which is the average of the displacement of said second and third points from said reference focus plane.

24. A drawing surface adjusting mechanism according to claim 21, wherein said adjustable support moves said workpiece relative to said optical system such that said line passing between said first and second points and between said second and third points is disposed substantially on said reference focus plane.

* * * * *